US008829497B2

(12) United States Patent
Kijima

(10) Patent No.: US 8,829,497 B2
(45) Date of Patent: Sep. 9, 2014

(54) DISPLAY ELEMENT, DISPLAY DEVICE, AND ELECTRONIC APPARATUS

(75) Inventor: Yasunori Kijima, Tokyo (JP)

(73) Assignee: Sony Corporation (JP)

( * ) Notice: Subject to any disclaimer, the term of this patent is extended or adjusted under 35 U.S.C. 154(b) by 171 days.

(21) Appl. No.: 13/403,726

(22) Filed: Feb. 23, 2012

(65) Prior Publication Data

US 2012/0241726 A1 Sep. 27, 2012

(30) Foreign Application Priority Data

Mar. 24, 2011 (JP) ................................. 2011-066746

(51) Int. Cl.
*H01L 51/46* (2006.01)
*H01L 51/52* (2006.01)
*H01L 51/00* (2006.01)
*H01L 27/32* (2006.01)

(52) U.S. Cl.
CPC ......... *H01L 51/5278* (2013.01); *H01L 51/0084* (2013.01); *H01L 51/0081* (2013.01); *H01L 27/3209* (2013.01); *H01L 51/0077* (2013.01); *H01L 51/0055* (2013.01); *H01L 51/0051* (2013.01); *H01L 51/0053* (2013.01)
USPC ..................................... 257/40; 257/E51.026

(58) Field of Classification Search
USPC ............................................. 257/40, E51.026
See application file for complete search history.

(56) References Cited

U.S. PATENT DOCUMENTS

2003/0170491 A1* 9/2003 Liao et al. ...................... 428/690
2006/0087225 A1* 4/2006 Liao et al. ...................... 313/504

FOREIGN PATENT DOCUMENTS

| JP | 11-329748 | 11/1999 |
| JP | 2003-045676 | 2/2003 |
| JP | 2003-272860 | 9/2003 |
| JP | 2009-302586 | 12/2009 |
| WO | 2007/027441 | 3/2007 |
| WO | 2007/066898 | 6/2007 |

* cited by examiner

*Primary Examiner* — Zandra Smith
*Assistant Examiner* — Lawrence Tynes, Jr.
(74) *Attorney, Agent, or Firm* — Sheridan Ross P.C.

(57) ABSTRACT

Disclosed herein is a display element, including plural light emitting units laminated through a connection layer between a first electrode and a second electrode. The connection layer contains therein at least one or more kinds of materials having a photoelectric conversion function. A display device includes plural display elements. Each of the display elements includes plural light emitting units laminated through a connection layer between a first electrode and a second electrode, and the connection layer contains therein at least one or more kinds of materials having a photoelectric conversion function. An electronic apparatus includes a display device including plural display elements and serving as a display portion. Each of the display elements includes plural light emitting units laminated through a connection layer between a first electrode and a second electrode, and the connection layer contains therein at least one or more kinds of materials having a photoelectric conversion function.

20 Claims, 8 Drawing Sheets

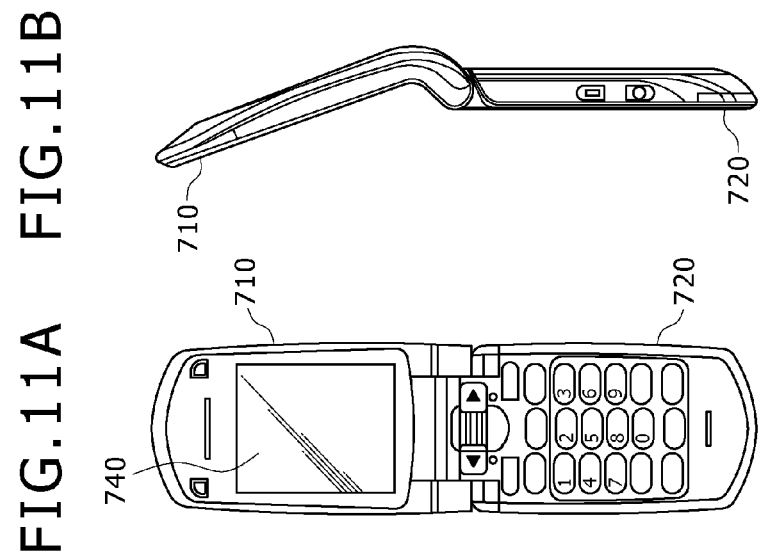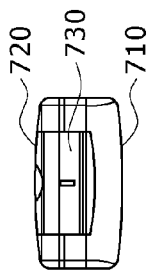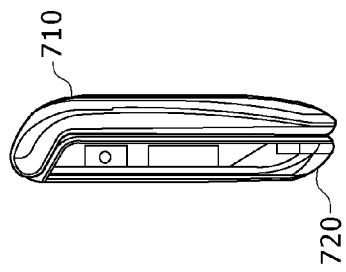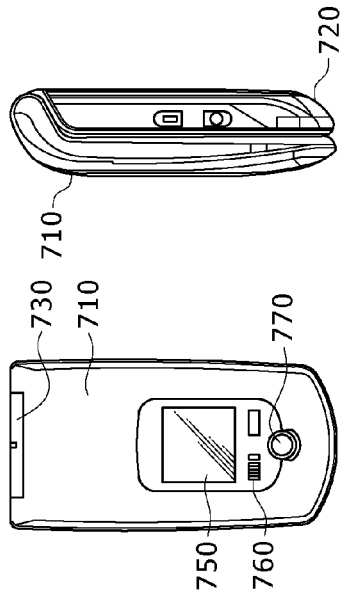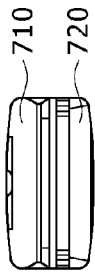

DISPLAY ELEMENT, DISPLAY DEVICE, AND ELECTRONIC APPARATUS

BACKGROUND

The present disclosure relates to a display element which emits a light by utilizing an organic electro luminescence (EL) phenomenon, a display device including the same, and an electronic apparatus including the display device.

Although an organic EL element attracts attention as a major candidate of next-generation display elements, it becomes a problem that a luminous efficiency is low and a life is short.

The life of the organic EL element (display element) generally depends on the electric charges injected, and the life characteristics can be improved by reducing an initial luminance in drive. However, by reducing the initial luminance, as a result, an application in practical realization is limited, and the potential possibility of the display element is negated by the organic EL element itself. For this reason, it is necessary to realize an element structure in which the luminance can be increased without changing a drive current, that is, the luminous efficiency can be improved, or the same luminance can be obtained even when the drive current is reduced.

Under such circumstances, a stack type multi-photo emission element (MPE element) has been proposed. For example, Japanese Patent Laid-Open No. Hei 11-329748 proposes an element in which plural organic layers including at least a light emitting layer are electrically joined in series with one another through a connection layer (intermediate conductive layer).

In addition, Japanese Patent Laid-Open Nos. 2003-45676 and 2003-272860 each disclose a concrete element structure for realizing the MPE element. According to Japanese Patent Laid-Open Nos. 2003-45676 and 2003-272860, it is described that theoretically, the lamination of two light emission units can improve a luminous efficiency (cd/A) without changing an electric power efficiency (lm/W) by a factor of 2, and the lamination of three light emission units can improve the luminous efficiency (cd/A) without changing the electric power efficiency (lm/W) by a factor of 3.

SUMMARY

Actually, however, the improvement in the luminous efficiency as described above is not yet obtained. This is caused by bathocuproine (BCP) and cesium (Cs) or Alq3 and lithium (Li) which are used as the materials for the connection layer (either an intermediate conductive layer or an electric charge generating layer). The connection layer made of these materials involves a problem that a stoichiometric proportion of the materials is important, and thus when a balance of the stoichiometric proportion is lost, the connection layer becomes unstable in terms of a layer.

For example, the BCP has a high ability to form a complex, and thus the possibility that when there is a free component, the BCP forms a complex together with the circumferential material. As a result, the BCP is difficult to use from a viewpoint of the stability of the element. In addition thereto, the element using the BCP is poor in reliability for environment resistance. On the other hand, a material such as $V_2O_5$ or $Re_2O_7$ used as the material so as to substitute for the BCP is large in deliquescent property and thus is very hard to treat. Since it is absolutely imperative for the MPE element to efficiently carry out the injection of the electrons or/and the injection of the holes from the connection layer, the efficiency of the injection of the holes and the electrons becomes a very important point for the element technique for structuring the MPE element.

However, when the mass production is taken into consideration, it is obvious that the case where the MPE element is made of a single material is more advantageous than the case where the MPE element is made of plural materials as described above in terms of the manufacturing processes and also in terms of the yield of the product. For example, when the mass production process is suppressed, it becomes a problem in design of a co-evaporation portion that a metal and an organic material are largely different in evaporation temperature from each other. In addition, when the metal is a metal having a high activity typified by an alkaline metal or an alkaline earth metal, an evil such as contamination with the organic layer is caused. From these facts, all of the connection layers are preferably made of the organic materials.

From the foregoing, Japanese Patent Laid-Open No. 2009-302586 reports an organic light emitting diode using a PIN type connection layer having a lamination structure composed of organic materials. In this case, a structure in which holes and electrons are drawn into a P-type layer and an N-type layer, respectively, is disclosed. An I-type layer is made of an insulating material, and plays a part of separating the P-type layer and the N-type layer from each other. In addition thereto, as disclosed in PCT Patent Publication No. WO07/066,898 and PCT Patent Publication No. WO07/027,441, connection layers all of which are made of organic materials are developed.

However, the sufficient luminous efficiency is not yet obtained in the existing display element, including the display elements given Japanese Patent Laid-Open No. 2009-302586 and PCT Patent Publication No. WO07/066,898 and PCT Patent Publication No. WO07/027,441, respectively, and thus further improvement is desired.

The present disclosure has been made in order to solve the problems described above, and it is therefore desirable to provide a display element in which a luminous efficiency can be enhanced and life characteristics can be improved, a display device including the same, and an electronic apparatus including the display device.

In order to attain the desire described above, according to an embodiment of the present disclosure, there is provided a display element, including plural light emitting units laminated through a connection layer between a first electrode and a second electrode. The connection layer contains therein at least one or more kinds of materials having a photoelectric conversion function.

According to another embodiment of the present disclosure, there is provided a display device, including plural display elements. Each of the plural display elements includes plural light emitting units laminated through a connection layer between a first electrode and a second electrode, and the connection layer contains therein at least one or more kinds of materials having a photoelectric conversion function.

According to still another embodiment of the present disclosure, there is provided an electronic apparatus, including a display device including plural display elements and serving as a display portion. Each of the plural display elements includes plural light emitting units laminated through a connection layer between a first electrode and a second electrode, and the connection layer contains therein at least one or more kinds of materials having a photoelectric conversion function.

In the display element, the display device, including the display elements, and the electronic apparatus, including the display device, of the present disclosure, plural light emitting units are laminated through the connection layer made of the material having the photoelectric conversion function, thereby enhancing the efficiency of the injection of the electric charges into each of the light emitting layers within the light emitting units.

As set forth hereinabove, according to an embodiment of the present disclosure, since the photoelectric conversion function is given to the connection layer through which the plural light emitting units are connected to one another, the efficiency of the injection of the electric charges into the light emitting units is enhanced. As a result, since an amount of electric charges injected into the light emitting layers within the light emitting units increases, both of the luminous efficiency and the life characteristics are improved.

BRIEF DESCRIPTION OF THE DRAWINGS

FIGS. 11A to 11G are respectively a front view of a mobile phone as a fifth example of application, in an open state, to which the display device shown in FIG. 3 of the second embodiment is applied, a side elevational view thereof in the open state, a front view thereof in a closed state, a left side elevational view thereof in the closed state, a right side elevational view thereof in the closed state, a top plan view thereof in the closed state, and a bottom view thereof in the closed state.

DETAILED DESCRIPTION OF THE PREFERRED EMBODIMENTS

Embodiments of the present disclosure will be described in detail hereinafter with reference to the accompanying drawings. It is noted that the description will be given below in accordance with the following order.

Figure 1:
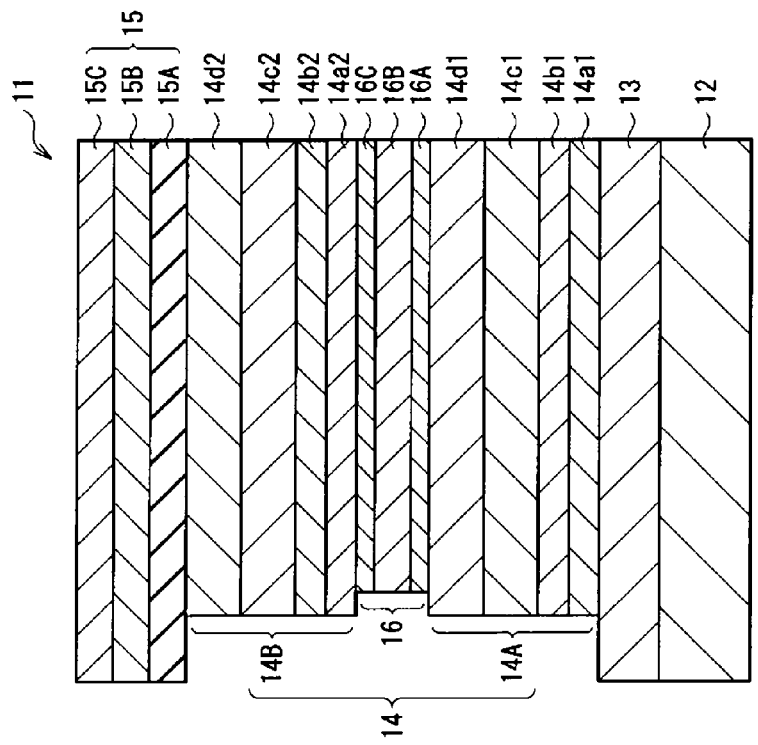
FIG. 1 is a cross sectional view showing a structure of a display element according to a first embodiment of the present disclosure.

1. First Embodiment
1-1. Display Element
1-2. Change of First Embodiment
2. Second Embodiment: Display Device
3. Third Embodiment: Electronic Apparatus
4. Module and Examples of Application
5. Examples 1. First Embodiment 1-1. Display Element FIG. 1 shows a cross-sectional structure of a display element 11 according to a first embodiment of the present disclosure. The display element 11 has a structure in which an anode (first electrode) 13, an organic layer 14 including a first light emitting unit 14A and a second light emitting unit 14B, and a cathode (second electrode) 15 are laminated in this order on a substrate 12. In the first light emitting unit 14A, a hole injection layer 14$a$1, a hole transport layer 14$b$1, a light emitting layer 14$c$1, and an electron transport layer 14$d$1 are laminated in this order from the anode 13 side. Also, in the second light emitting unit 14B, a hole injection layer 14$a$2, a hole transport layer 14$b$2, a light emitting layer 14$c$2, and an electron transport layer 14$d$2 are laminated in this order from the anode 13 side. The second light emitting unit 14B is laminated on the first light emitting unit 14A through a connection layer 16.

The display element 11 is a top-emission type display element in which a light which is emitted when a hole injected from the anode 13, and an electron injected from the cathode 15 are recombined with each other within the light emitting layer 14$c$2 of the second light emitting unit 14B is taken out from a side (the cathode 15 side) opposite to the substrate 12. Usage of the top-emission type display element 11 increases an aperture ratio of a light emitting portion of a display device. It is noted that the structure of the top-emission type display element 11 is by no means limited to such a structure and, for example, a transmission type display element, that is, bottom-emission type display element may also be adopted in which a light is taken out from the substrate 12 side.

The substrate 12 is a supporting body in which plural display elements 11 are disposed and formed on one principal surface side thereof, and thus may be known one. For example, the substrate 12 is made of a quartz, a glass, a metallic foil, a film or sheet made of a resin, or the like. In particular, the substrate 12 is preferably made of the quartz or the glass. When the substrate 12 is made of the resin, a methacrylic resin class typified by polymethylmethacrylate (PMMA), a polyester class such as polyethylene terephthalate (PET), polyethylene naphthalate (PEN) or polybutylene naphthalate (PBN), a polycarbonate resin or the like is given as the material for the substrate 12. In this case, however, it is necessary to adopt a lamination structure which suppresses both of the water permeability and the gas permeability, and it is also necessary to carry out the surface treatment.

The anode 13, for example, has a thickness in a lamination direction (hereinafter simply referred to as "a thickness") which is equal to or larger than 10 nm and equal to or smaller than 300 nm. For the purpose of efficiently injecting the holes into the organic layer 14 (the first light emitting unit 14A), the anode 13 is preferably made of an electrode material which has a large work function from a vacuum level. Specifically, there is given a simple substance of chromium (Cr), gold (Au), platinum (Pt), nickel (Ni), copper (Cu), tungsten (W), silver (Ag) or the like or an alloy thereof. In addition, the anode 13 may have a lamination structure of a metallic film made of a simple substance or alloy of such metallic elements, and a transparent conductive film made of an Indium Tin Oxide (ITO), an Indium Zinc Oxide (InZnO), an alloy of a zinc oxide (ZnO) and aluminum (Al), and the like.

In particular, in the case of the top-emission type display element, an electrode having a high reflectivity is used as the anode 13, whereby the efficiency of taking out the light to the outside is improved due to the interference effect and the high reflectivity effect. For example, the anode 13 preferably adopts a lamination structure of a first layer which is excellent in light reflecting property, and a second layer which is provided on an upper portion of the first layer and which has light permeability and a large work function. Here, the first layer is preferably made of an alloy mainly containing therein Al as a principal component. Also, an element which has a relatively smaller work function than that of Al as the principal component is used as an accessary component in the first layer. Any of lanthanoid series elements is preferably used as such an accessary component. Although the work function of any of the lanthanoid series elements is not large, the stability of the anode is increased and the hole injection property of the anode is fulfilled by containing these elements in accessary component. Also, in addition to any of the lanthanoid series elements, an element such as silicon (Si) or copper (Cu) may also be used as the accessary component of the first layer.

The second layer can be made of an oxide of an Al alloy, an oxide of molybdenum (Mo), an oxide of zirconium (Zr), an oxide of chromium (Cr), or an oxide of tantalum. For example, when the second layer is composed of an oxide layer (including a natural oxide film) of an Al alloy containing therein any of the lanthanoid series elements as the accessary component, since the oxide of any of the lanthanoid series elements has the high transmittance, the transmittance of the second layer containing therein the oxide of any of the lanthanoid series elements as the accessary component become excellent. As a result, the reflectivity on the surface of the first layer is kept high. In addition, a transparent conductive layer made of an ITO, an IZO or the like in the second layer improves the electron injection property of the anode 13. It is noted that since each of the ITO and the IZO has the large work function, by using the ITO or the IZO on the side contacting the substrate 12, that is, in the first layer, the carrier injection efficiency can be enhanced, and also the adhesion between the anode 13 and the substrate 12 can be enhanced.

It is noted that when a system for driving a display device 1 including plural display elements 11 is an active matrix system, the anode 13 is formed through patterning every pixel, and thus is provided so as to be connected to a thin film transistor (TFT) for driving (not shown) provided on the substrate 12. In this case, a structure is adopted in which partition walls 17 (refer to FIG. 5) are provided on the anode 13, and thus surfaces of the anodes 13 are exposed through opening portions of the partition walls 17, correspondingly.

The organic layer 14 includes the first light emitting unit 14A and the second light emitting unit 14B which are connected to each other through the connection layer 16 which will be described later. The first light emitting unit 14A has a structure in which, for example, the hole injection layer 14$a$1, the hole transport layer 14$b$1, the light emitting layer 14$c$1, and the electron transport layer 14$d$1 are laminated in this order from the anode 13 side. The second light emitting unit 14B has a structure in which, for example, the hole injection layer 14$a$2, the hole transport layer 14$b$2, the light emitting layer 14$c$2, and the electron transport layer 14$d$2 are laminated in this order from the anode 13 side. Although details will be described later, the organic layer 14 including the first light emitting unit 14A and the second light emitting unit 14B is formed by, for example, utilizing a vacuum evaporation, a spin coating method or the like. An upper surface of the second light emitting unit 14B is covered with the cathode 15. Although thicknesses, composing materials and the like of the individual layers composing the organic layer 14 are especially by no means limited, an example thereof will be described below.

The hole injection layers 14$a$1 and 14$a$2 are buffer layers for enhancing the efficiencies of the injection of the holes into the light emitting layers 14$c$1 and 14$c$2, respectively, and preventing generation of a leakage current. A thickness of each of the hole injection layers 14$a$1 and 14$a$2, for example, is preferably set in the range of 5 to 200 nm, and is more preferably set in the range of 8 to 150 nm. A material composing each of the hole injection layers 14$a$1 and 14$a$2 may be suitably selected in relation to the materials composing the electrodes and the adjacent layer. Thus, the material, for example, includes polyaniline and a derivative thereof, polythiophene and a derivative thereof, polypyrrole and a derivative thereof, polyphenylenevinylene and a derivative thereof, polythienylenevinylene and a derivative thereof, polyquinoline and a derivative thereof, polyquinoxaline and a derivative thereof, a conductive high-molecular material such as polymer containing an aromatic amine structure in a main chain or side chain thereof, metal phthalocyanine (such as copper phthalocyanine), carbon or the like. A concrete example of the conductive high-molecular material includes oligoaniline and polydioxythiophene such as poly(3,4-ethylenedioxythiophene) (PEDOT).

The hole transport layers 14$b$1 and 14$b$2 are layers for enhancing the efficiencies of the transport of the holes to the light emitting layers 14$c$1 and 14$c$2, respectively. Although depending on the entire structure of the element, a thickness of each of the hole transport layers 14$b$1 and 14$b$2, for example, is preferably set in the range of 5 to 200 nm, and is more preferably set in the range of 8 to 150 nm. A luminescent material which is solubilized into an organic solvent, for example, polyvinylcarbazole and a derivative thereof, polyfluorene and a derivative thereof, polyaniline and a derivative thereof, polysilane and a derivative thereof, polysiloxane derivative having aromatic amine in a side chain or main chain thereof, polythiophene and a derivative thereof, polypyrrole, Alq3 or the like can be used as the material composing each of the hole transport layers 14$b$1 and 14$b$2.

In each of the light emitting layers 14$c$1 and 14$c$2, the application of the electric field recombines the electron and the hole with each other to emit a light. Although depending on the entire structure of the element, a thickness of each of the light emitting layers 14$c$1 and 14$c$2, for example, is preferably set in the range of 10 to 200 nm, and is more preferably set in the range of 20 to 150 nm. Each of the light emitting layers 14$c$1 and 14$c$2 may have either a single layer or a lamination layer. For example, the light emitting layer 14$c$1 may have a lamination layer of a red color light emitting layer and a green color light emitting layer, and the light emitting layer 14$c$2 may have a single layer of a blue light emitting layer, thereby structuring a white light emitting element. In addition thereto, the light emitting layer 14$c$1 may be structured as an orange color light emitting layer, and the light emitting layer 14$c$2 may be structured as a blue-green color light emitting layer, thereby structuring a white light emitting element.

Materials corresponding to respective light emission colors need only to be used as the materials composing the light emitting layers 14$c$1 and 14$c$2. For example, the materials composing the light emitting layers 14$c$1 and 14$c$2 include a material which is obtained by doping a polyfluorene system polymer derivative, a (poly)paraphenylenevinylene derivative, a polyphenylene derivative, a polyvinylcarbazole derivative, a polythiophene derivative, a perylene system pigment, a coumarin system pigment, a Rhodamine system pigment or the high-molecular material described above with an organic EL material. For example, rubrene, perylene, 9,10-diphenylanthracene, tetraphenylbutadiene, nile red, coumarin 6 or the like can be used as the doping material. It is noted that materials which are obtained by mixing two or more kinds of materials described above with one another may also be used as the materials composing the light emitting layers 14$c$1 and 14$c$2. In addition, the materials composing the light emitting layers 14$c$1 and 14$c$2, respectively, are by no means limited to the high-molecular materials described above, and thus materials which are obtained by combining low-molecular materials with one another may also be used as the materials composing the light emitting layers 14$c$1 and 14$c$2. An example of the low-molecular material includes benzine, styrylamine, triphenylamine, porphyrin, triphenylene, azatriphenylene, tetracyanoquinodimethane, triazole, imidazole, oxadiazole, polyarylalkane, phenylenediamine, arylamine, oxazole, anthracene, fluorenone, hydrazone, stilbene or derivatives thereof, or heterocyclic conjugate system monomer or oligomer of a polysilane system compound, a vinylcarbazole system compound, a thiophene system compound, an aniline system compound or the like.

In addition to the materials described above, a material having a high luminous efficiency as a luminescence guest material, for example, an organic luminescent material such as a low-molecular fluorescent material, a phosphorescent pigment or a metallic complex can be used as the materials composing the light emitting layers $14c1$ and $14c2$.

It is noted that the light emitting layers $14c1$ and $14c2$, for example, either may be made light emitting layers having hole transport properties and serving as the hole transport layers $14b1$ and $14b2$ as well described above or may be made light emitting layers having electron transport properties and serving as electron transport layers $14d1$ and $14d2$ as well which will be described below.

The electron transport layers $14d1$ and $14d2$ are layers for enhancing the efficiencies of the transport of the electrons to the light emitting layers $14c1$ and $14c2$, respectively. Although depending on the entire structure of the element, a thickness of each of the electron transport layers $14d1$ and $14d2$, for example, is preferably set in the range of 5 to 200 nm, and is more preferably set in the range of 10 to 180 nm.

An organic material having an excellent electron transporting ability is preferably used as the materials for the electron transport layers $14d1$ and $14d2$. The enhancement of the efficiencies of the transport of the electrons to the light emitting layers $14c1$ and $14c2$ suppresses a change in a light emission color due to an electric field strength which will be described later. Specifically, for example, an arylpyridine derivative, a benzimidazole derivative or the like is preferably used. As a result, even with a low-drive voltage, the high efficiency of the supply of the electrons is maintained. In addition thereto, an alkaline metal, an alkaline earth metal, a rare earth metal and an oxide thereof, a composite oxide thereof, a fluoride thereof, a carbonate thereof or the like can be used as the material for the electron transport layer $14d1$, $14d2$.

The connection layer 16 is provided in order to connect the first light emitting unit 14A and the second light emitting unit 14B to each other. The connection layer 16 in the first embodiment has a photoelectric conversion function in addition to the connection function. The connection layer 16 has a structure in which, for example, an electron injection layer 16A, an intermediate layer 16B, and a hole injection layer 16C are laminated in this order from the anode 13 side. Although depending on the structure of the element, a thickness of the entire connection layer 16, for example, is preferably set in the range of 1 to 100 nm, and is more preferably set in the range of 10 to 50 nm.

Materials composing the connection layer 16 are suitably selected in accordance with the characteristics of the adjacent layers of the organic layer 14 (especially, the electron transport layer $14d1$ in the first light emitting unit 14A, and the hole injection layer $14a2$ in the second light emitting unit 14B). Hereinafter, the materials of the electron injection layer 16A, the intermediate layer 16B, and the hole injection layer 16C will be exemplified.

The electron injection layer 16A has an electron donor property. For example, an electron transport material which is doped with an N-type dopant, specifically, the material which, for example, is given in each of the electron transport layers $14d1$ and $14d2$ described above can be used as the material of the electron injection layer 16A. The N-type doping material, for example, includes an alkaline metal, an alkaline earth metal, or an oxide thereof, a composite oxide thereof, a fluoride thereof, an organic complex thereof or the like.

In particular, when an electron mobility of the electron transport layer $14d1$ of the first light emitting unit 14A is relatively large and thus there is no large injection hindrance between the electron transport layer $14d1$ and the electron injection layer 16A, there are given materials each of which is low in electronegativity and is excellent in electron donor property. Of these materials, the material which is small in light absorption in a visible light region in a film state is preferable. Specifically, there, for example, is given an alkaline metal such as Li, Na, K, Rb or Cs, or an alkaline earth metal such as Be, Mg, Ca, Sr, Ba or Ra.

The electron injection layer 16A (electron donor unit) may be made of either the alkaline metal or alkaline earth metal described above in the form of a simple substance. However, a co-evaporation film is formed with Ag, In, Al, Si, Ge, Au, Cu or Zn, thereby making it possible to enhance the stability of the film state. It is noted that the co-evaporation film may be formed in the form of a mixed film using three or more kinds of metals described above. In this case, for the purpose of suppressing the optical light absorption loss as much as possible, after the function can be shown and the stability is ensured in terms of the film, the film thickness is preferably thinned as much as possible. For example, 5 nm or less is the suitable film thickness. In addition, the electron donor unit 16A formed by utilizing the co-evaporation method may be composed of a mixed film using the alkaline metal or alkaline earth metal described above, and the organic material. Although the material having the high electron transport property is preferable as the organic material for mixing, the material having the high insulating property or the hole transport material may also be used. For example, the material such as Alq3 or α-NPD can be used. In addition, an organic material which forms a metallic complex with the alkaline metal and the alkaline earth metal is preferably used from a viewpoint of the stability in the film made of the alkaline metal and the alkaline earth metal. Specifically, there is given bathophenanthroline or bathocuproine, or an organic material having a skeleton, which is easy to form a complex, such as an oxadiazole skeleton.

The intermediate layer 16B has the photoelectric conversion property, and contains therein at least one kind of material having the photoelectric conversion property. As a result, there are enhanced the efficiencies of the transport of the holes and the electrons which are injected from the anode 13 side and the cathode 15 side into the first light emitting unit 14A and the second light emitting unit 14B, respectively. Such a material is preferably a material in which an energy level of the lowest unoccupied molecular orbital (LUMO) of the intermediate layer 16B is equal to or smaller than a shallow value when viewed from the vacuum level of the LUMO of each of the electron injection layer 16A (electron donor unit) and the hole injection layer 16C (electron acceptor unit) each being adjacent to the intermediate layer 16B, and more preferably becomes a shallower level. In addition, such a material is preferably a material in which the energy level of the highest occupied molecular orbital (HOMO) of the photoelectric conversion unit 16B is preferably equal to or smaller than a deep value when viewed from the vacuum level of the HOMO of each of the electron donor unit 16A and the electron acceptor unit 16C each being adjacent to the photoelectric conversion unit 16B, and more preferably becomes the deeper level.

Specifically, a perylene derivative represented by the general formula (1), a porphyrin derivative represented by the general formula (2), a phthalocyanine derivative represented by the general formula (3), naphthalocyanine derivative represented by the general formula (4), and a pentacene derivative represented by the general formula (5) are preferably used:

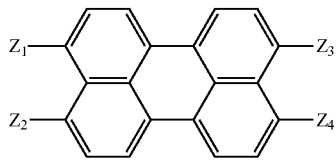
(1)

in which Z1 to Z4 are independently groups each having a carbonyl group or derivatives thereof, and Z1, Z2, Z3, and Z4 may form cyclic structures each obtained through nitrogen or oxygen, respectively;

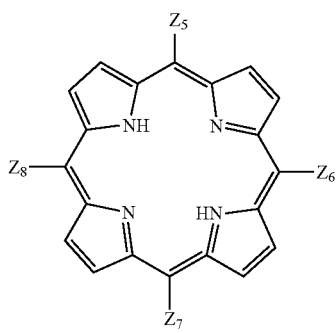
(2)

in which Z5 to Z8 are independently aromatic ring groups, heterocyclic groups or derivatives thereof, respectively;

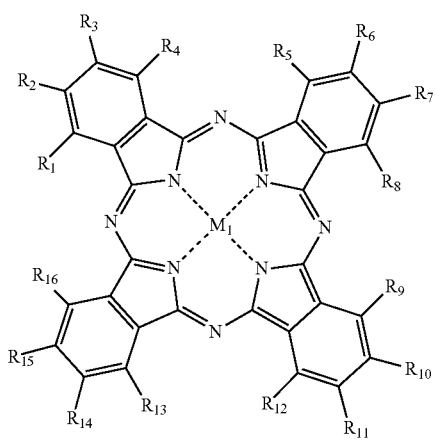
(3)

in which R1 to R16 are independently hydrogen atoms, halogen atoms, hydrocarbon groups each having a carbon number of 1 to 12 or derivatives thereof, respectively, and M1 is a metallic atom belonging to any of IV to XIV groups in the periodic table, or an atomic group containing therein the metallic atom concerned, an oxygen atom, a halogen atom, a cyano group, a methoxy group or the like as a ligand;

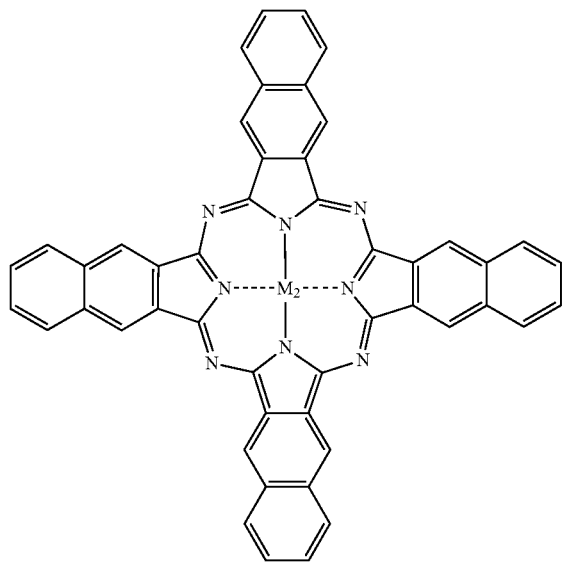
(4)

in which M2 is a metallic atom belonging to any of IV to XIV groups in the periodic table, or an atomic group containing therein the metallic atom concerned, an oxygen atom, a halogen atom, a cyano group, a methoxy group or the like as a ligand; and

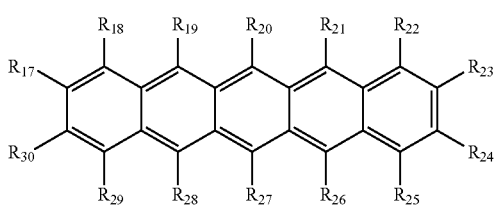
(5)

in which R17 to R30 are independently hydrogen atoms, halogen atoms, hydrocarbon groups each having a carbon number of 1 to 12 or derivatives thereof, respectively.

It is noted that of the metallic atoms belonging to the IV to XIV groups of the periodic table, the IV group (especially, Ti), the V group (especially, V), the VI group (especially, Mo), the VII group (especially, Mn), the VIII group (Fe, Ru, Os), the IX group (Co, Rh, Ir), the X group (Ni, Pd, Pt), the XI group (especially, Cu), the XII group (especially, Zn), the XIII group (especially, Al), or the XIV group (especially, Pb) is preferably used.

A concrete example of the perylene derivative represented by the general formula (1) includes compounds represented by the structural formulas (1-1) to (1-3), respectively:

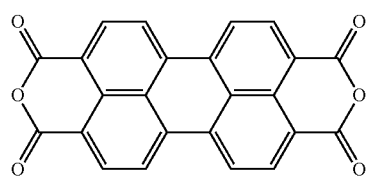
(1-1)

(1-2)
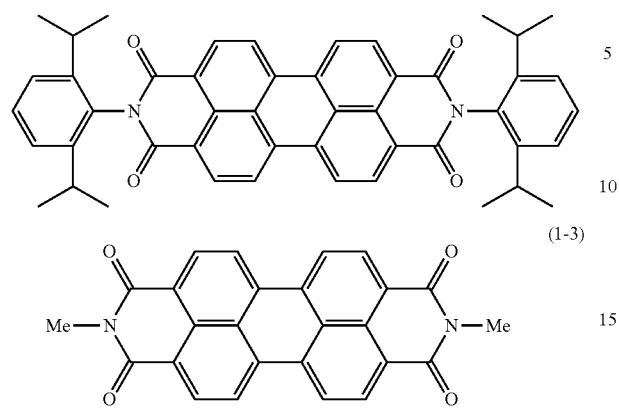
(1-3)
A concrete example of the porphyrin derivative represented by the general formula (2) includes compounds represented by the structural formulas (2-1) to (2-4), respectively:
(2-1)
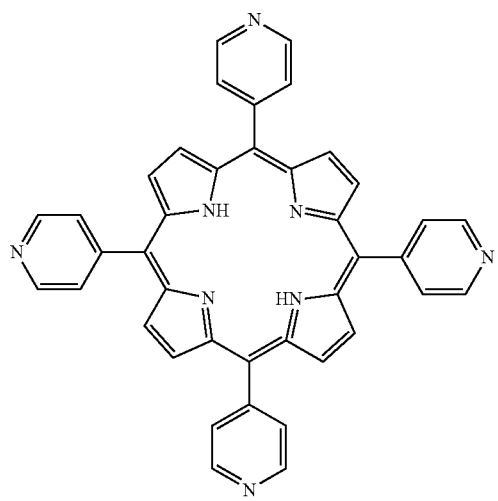
(2-2)
(2-3)
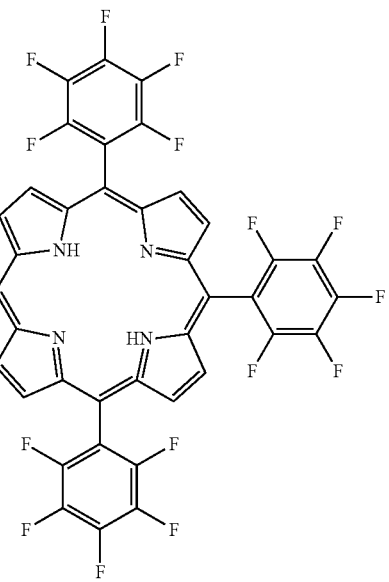
(2-4)
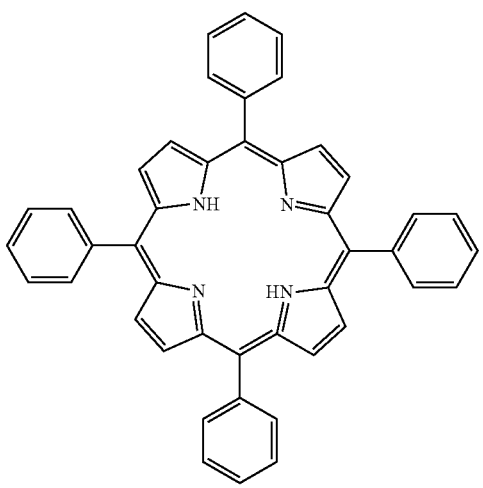
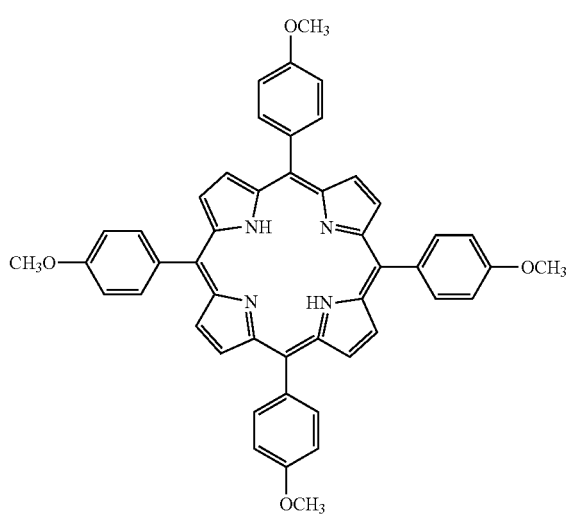
A concrete example of the phthalocyanine derivative represented by the general formula (3) includes compounds represented by the structural formulas (3-1) to (3-17), respectively:

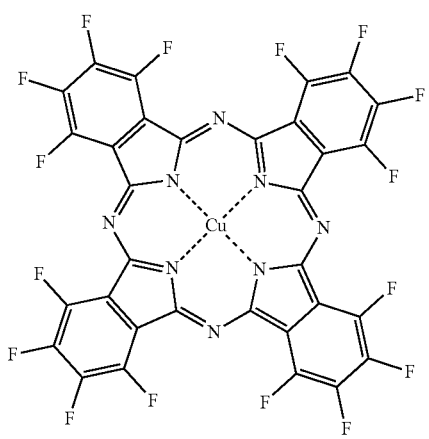
(3-1)
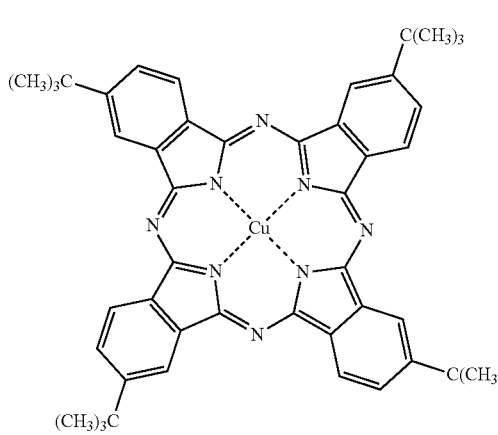
(3-2)
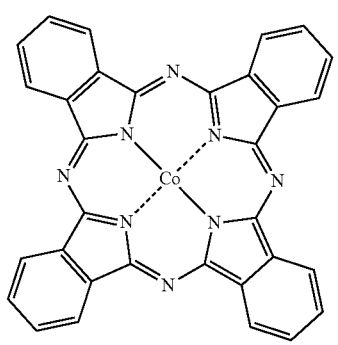
(3-3)
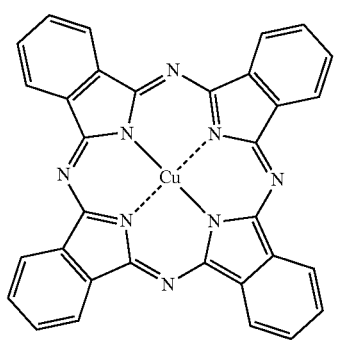
(3-4)
(3-5)
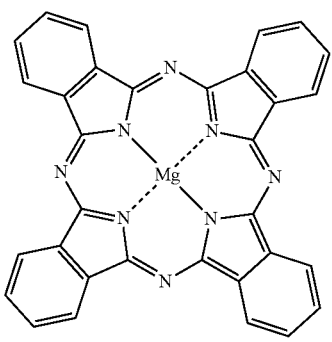
(3-6)
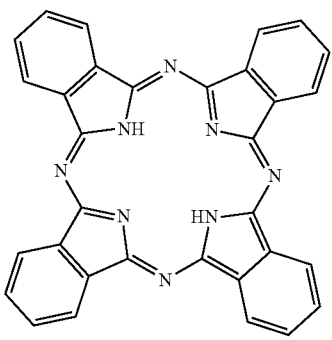
(3-7)
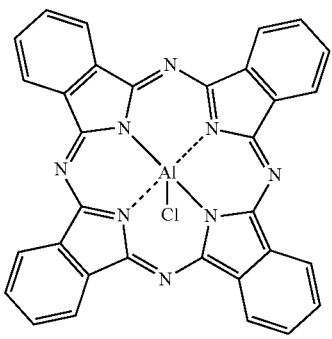
(3-8)

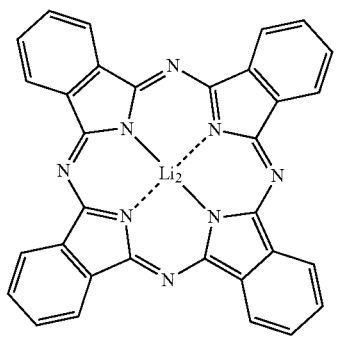
(3-9)
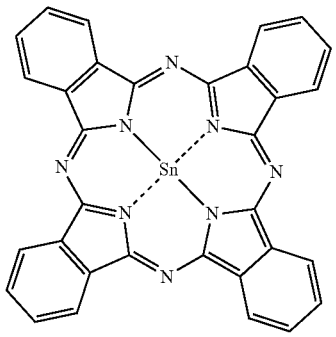
(3-13)
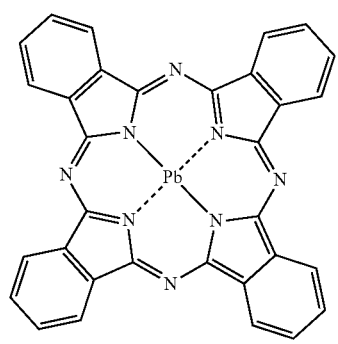
(3-10)
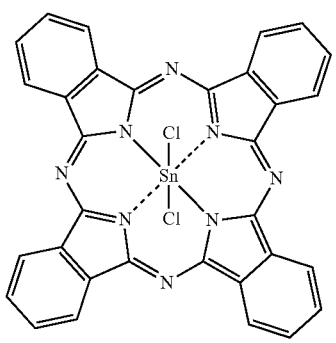
(3-14)
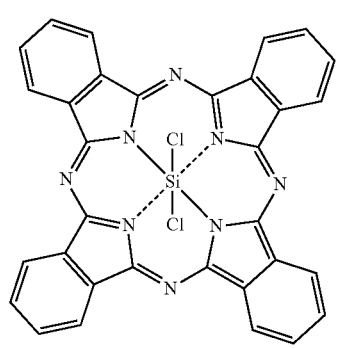
(3-11)
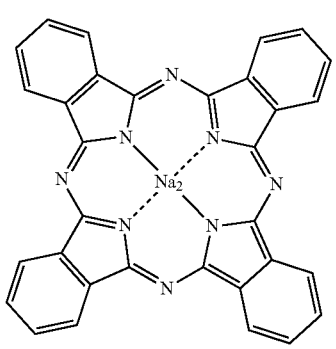
(3-15)
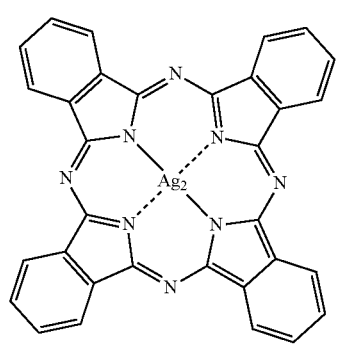
(3-12)
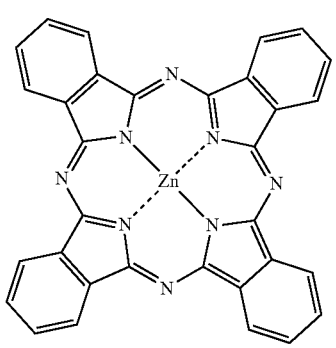
(3-16)

-continued (3-17)

A concrete example of the naphthalocyanine derivative represented by the general formula (4) includes a compound represented by the structural formula (4-1):

(4-1)

A concrete example of the pentacene derivative represented by the general formula (5) includes a compound represented by the structural formula (5-1):

(5-1)

In addition to the components described above, the material having the photoelectric conversion function includes fullerene, carbon nano tube, and grapheme each having a carbon number of 60 or more, and a derivative thereof represented by the structural formulas (6-1) to (6-4), respectively:

(6-1)

(6-2)

(6-3)

-continued (6-4)

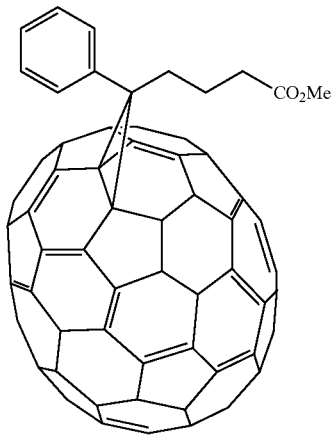

The hole injection layer 16C (electron acceptor unit) has the electron acceptor property. A hole transport material doped with a P-type dopant, for example, is used as a material for the hole injection layer 16C. The materials given in the hole transport layers 14b1 and 14b2 described above, respectively, for example, can be each used as the hole transport material. The P-type doping material, for example, includes 7,7,8,8-tetracyano-2,3,5,6-tetrafluoroquinodimethane (F4-TCNQ) and hexaazacyanotriphenylene (HAT-6CN).

In particular, when there is no large injection hindrance between the hole injection layer 14a2 of the second light emitting unit 14B, and the electron acceptor unit 16C, it is possible to use the way of thinking similar to that in the material selection in the electron donor unit 16A described above. For example, it is possible to use an organic material which is excellent in the electron acceptor property. Specifically, an electron acceptor organic material, having a skeleton, such as azatriphenylene or TCNA can be formed in the form of either a single layer or a mixed film mixed with a metal or the like. In addition thereto, an organic material having a large hole mobility may also be formed in the form of either a single layer or a mixed layer mixed with a method or the like similarly to the case of the electron acceptor organic material. Here, the metal, for example, means the alkaline metal, the alkaline earth metal containing therein Mg or a metal belonging to any of the IIIB group and the IVB group in the periodic table. In addition, a material which is small in light absorption in the visible light region in the film state is preferable similarly to the case of the electron donor unit 16A described above. In addition thereto, with regard to the thickness as well, for the purpose of suppressing the optical light absorption loss as much as possible, after the function can be shown and the stability is ensured in terms of the film, the film thickness is preferably thinned as much as possible. For example, 30 nm or less is the suitable film thickness.

It is noted that the N-type doping material, photoelectric conversion material, and P-type doping material described above are merely an example. Thus, all it takes is that the electrons and the holes can be efficiently transported to the first light emitting unit layer 14A and the second light emitting unit 14B, respectively, within the connection layer 16. In addition, the electron donor unit 16A and the electron acceptor unit 16C do not necessarily contain therein the doping materials described above, respectively. Thus, the electron donor unit 16A and the electron acceptor unit 16C may also be made of single materials, respectively, as long as the electron donor unit 16A and the electron acceptor unit 16C can secure the properties thereof.

Moreover, in the connection layer 16, either the electron donor unit 16A or the electron acceptor unit 16C may serve as the photoelectric conversion unit 16B as well. In addition, either the electron donor unit 16A or the electron acceptor unit 16C may be omitted and instead, the connection layer 16 may also be composed of the two layers. Or, both of the electron donor unit 16A and the electron acceptor unit 16C may not be provided, and thus the connection layer 16 may also be composed of the photoelectric conversion unit 16B.

The cathode 15, for example, is made of a material whose thickness is about 10 nm and which is excellent in light permeability and has a small work function. In addition, even when a transparent conductive film is made of an oxide, the taking-out of the light can be secured. In this case, a ZnO, an ITO, an InZnO, an InSnZnO or the like can be used. In addition thereto, although the anode 15 may also be composed of a single layer, in the first embodiment, for example, the cathode 15 has a structure in which a first layer 15A, a second layer 15B, and a third layer 15C are laminated in this order from the anode 13 side.

The first layer 15A is preferably made of a material which has a small work function and which is excellent in light permeability. Specifically, such a material includes the alkaline earth metal such as calcium (Ca) or barium (Ba), the alkaline metal such as lithium (Li) or cesium (Se), indium (In), magnesium (Mg) or silver (Ag). In addition thereto, such a material includes an alkaline metal oxide, an alkaline metal fluoride, an alkaline earth metal oxide, or an alkaline earth metal fluoride such as $Li_2O$, $Cs_2CO_3$, $Cs_2SO_4$, MgF, LiF or $CaF_2$.

The second layer 15B is made of a material, such as a thin film MgAg or Ca electrode material, which has light permeability and is excellent in conductivity. For the purpose of suppressing the deterioration of the electrode, preferably, a transparent lanthanoid system oxide is used as the material of the third layer 15C. As a result, the cathode 15 can be used as an encapsulating electrode from whose upper surface the light can be taken out. In addition, in the case of the bottom-emission type, gold (Au), platinum (Pt), AuGe or the like is used as the material of the third layer 15C.

It is noted that each of the first layer 15A, the second layer 15B, and the third layer 15C is formed by utilizing a method such as a vacuum evaporation method, a sputtering method or a plasma CVD (Chemical Vapor Deposition) method. In addition, when a drive system for the display device 1 (refer to FIG. 3) composed of the display element 11 is an active matrix system, the cathode 15 may be formed in the form of a solid-like film on the substrate 12 so as to be insulated from the anode 13 through a partition wall 17 (refer to FIG. 5) covering the circumference of the anode 13, and the organic layer 14, and thus may be used as an electrode common to the pixels.

In addition, the cathode 15 may also be composed of a mixed layer which contains therein an organic light emitting material such as an alumiquinoline derivative, a styrylamine derivative or a phthalocyanine derivative. In this case, the cathode 15 may specially have a layer such as a MgAg layer having the light permeability as a third layer (not shown). In addition, it goes without saying that the structure of the cathode 15 is by no means limited to the lamination structure as described above, and thus the cathode 15 may adopt an optical combination or a lamination structure in accordance with the structure of the device manufactured. For example, the cathode 15 in the first embodiment adopts the lamination structure in which the functions of the individual layers of the cathode 15 are separated from one another, that is, the inorganic layer (the first layer 15A) for facilitating the injection of the electrons into the organic layer 14, the inorganic layer (the second layer 15B) for controlling the electrode, and an inorganic layer (the third layer 15C) for protecting the electrode are separated from one another. However, the inorganic layer for facilitating the injection of the electrons into the organic layer 14 may serve as the inorganic layer as well for controlling the electrode, and also these layers may be formed in the form of a single layer structure.

In addition, when the display element 11 has a cavity structure, preferably, the cathode 15 is made of a semipermeable and semi-reflecting material. As a result, an emitted light which has been subjected to multiple interference between a light reflecting surface on the anode 13 side, and a light reflecting surface on the cathode 15 side is taken out from the cathode 15 side. In this case, it is supposed that an optical distance between the light reflecting surface on the anode 13 side and the light reflecting surface on the cathode 15 side is regulated depending on a wavelength of a light desired to be taken out, and the thicknesses of the individual layers are set so as to fulfill this optical distance. In such a top-emission type display element, the cavity structure is positively used. As a result, the efficiency of taking out the light to the outside can be improved, and the emission spectrum can be controlled.

1-2. Change of First Embodiment

Figure 2:
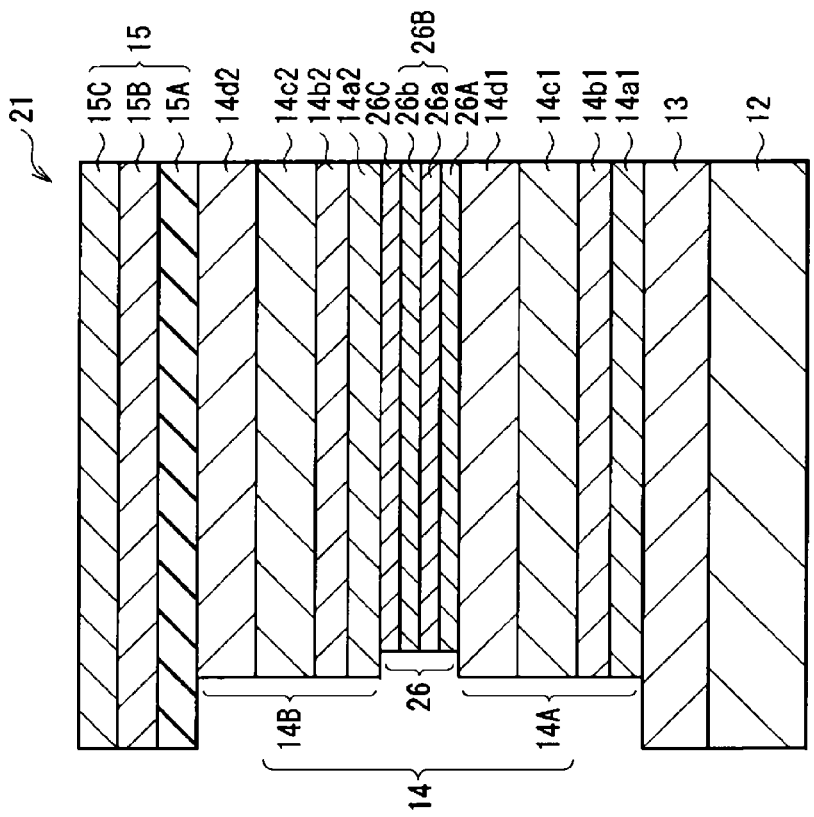
FIG. 2 is a cross sectional view showing a structure of a display element according to Change of the first embodiment of the present disclosure.

FIG. 2 shows a cross-sectional structure of a display element 21 according to Change of the first embodiment of the present disclosure. In the display element 21 of Change of the first embodiment, a connection layer 26 adopts a four-layer structure. Specifically, in the connection layer 26, an intermediate layer 26B (photoelectric conversion unit) is formed by laminating two layers: a first layer 26a; a second layer 26b. It is noted that the first layer 26a is an electron acceptor photoelectric conversion unit, and the second layer 26b is an electron donor photoelectric conversion unit. Even when the photoelectric conversion unit 26B is structured in the form of the two layers in such a manner, it is possible to obtain the same effects as those of the first embodiment described above. In addition, the connection layer 26 adopts such a structure, so that even when the number of layers composing the organic layer 14 is reduced, it is possible to obtain the same effects as those of the first embodiment described above. However, since it is possible that the stability in the long-term drive is reduced, in the light of the luminous efficiency, the stability in the long-term drive, and the like, it is necessary to suitably select the element structure.

2. Second Embodiment

Display Device

Figure 3:
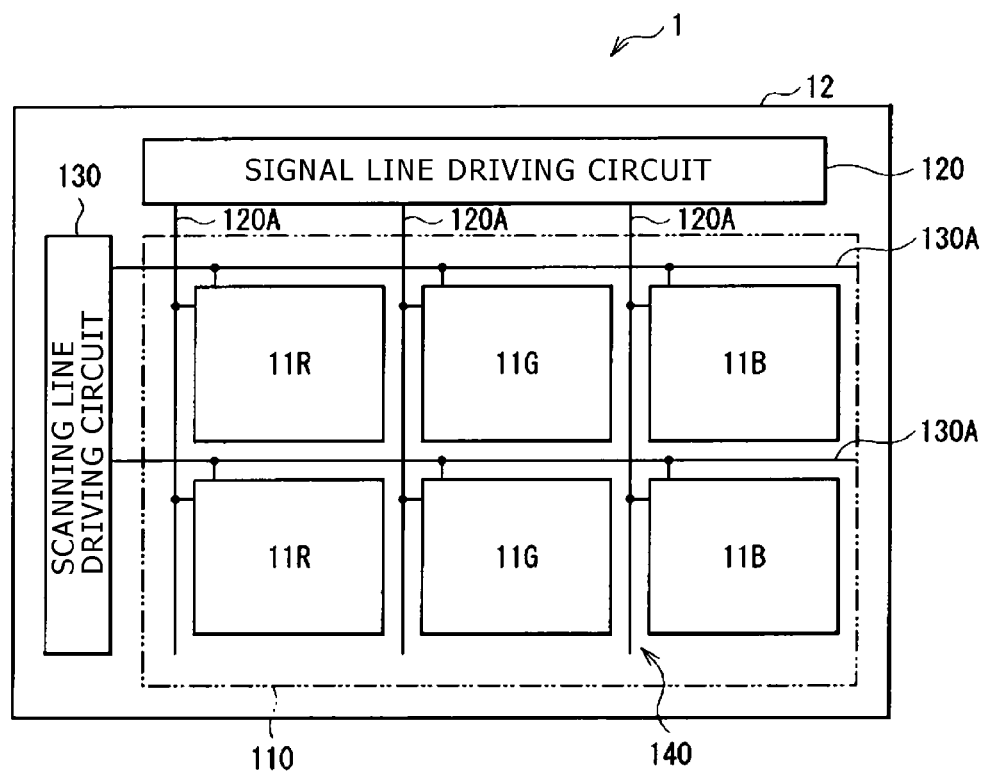
FIG. 3 is a block diagram showing a configuration of a display device, including the display element shown in FIG. 1, according to a second embodiment of the present disclosure.

FIG. 3 shows a configuration of the display device according to a second embodiment of the present disclosure including the display element 11 of the first embodiment. The display device 1 is used as a display device for an organic EL television set or the like. For example, in the display device 1, plural display elements 11 (for example, red light emitting elements 11R, green light emitting elements 11G, and blue light emitting elements 11B) are disposed as a display area 110 in a matrix on the substrate 12. A signal line driving circuit 120 and a scanning line driving circuit 130 serving as drivers for image display are provided in the circumference of the display area 110. It is noted that a combination of adjacent display elements 11 composes one pixel.

Figure 4:
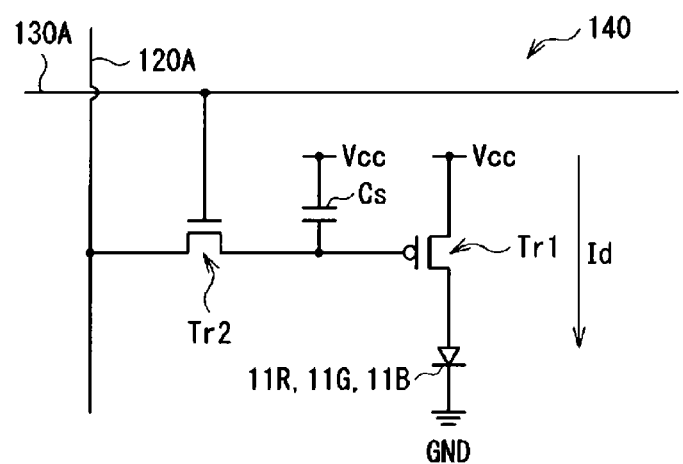
FIG. 4 is a circuit diagram showing a configuration of a part of a pixel driving circuit shown in FIG. 3.

A pixel driving circuit 140 is provided within the display area 110. FIG. 4 shows a configuration of a part of the pixel driving circuit 140. The pixel driving circuit 140 is an active type driving circuit formed in a lower layer of the anode 13. That is to say, the pixel driving circuit 140 includes a drive transistor Tr1, a write transistor Tr2, a capacitor (hold capacitor) Cs provided between the drive transistor Tr1 and the write transistor Tr2, and the display element 11 (for example, the red light emitting element 11R, the green light emitting element 11G or the blue light emitting element 11B) connected in series with the drive transistor Tr1 between a first power source line (set at Vcc) and a second power source line (set at GND). Each of the drive transistor Tr1 and the write transistor Tr2 is composed of a general thin film transistor (TFT) and a structure thereof, for example either may be a reverse staggered structure (so-called bottom-gate type) or may be staggered structure (top-gate type) and thus is especially by no means limited.

In the pixel driving circuit 140, plural signal lines 120A are disposed in a column direction, and plural scanning lines 130A are disposed in a row direction. A intersection between each signal line 120A and each scanning line 130A corresponds to any one (sub-pixel) of each display element 11. The signal lines 120A are all connected to the signal line driving circuit 120, and thus image signals are supplied from the signal line driving circuit 120 to source electrodes of the write transistor Tr2 through the signal lines 120A, respectively. The scanning lines 130A are all connected to the scanning line driving circuit 130, and thus scanning signals are successively supplied to gate electrodes of the write transistors Tr2 through the scanning lines 130A from the scanning line driving circuit 130, respectively.

Figure 5:
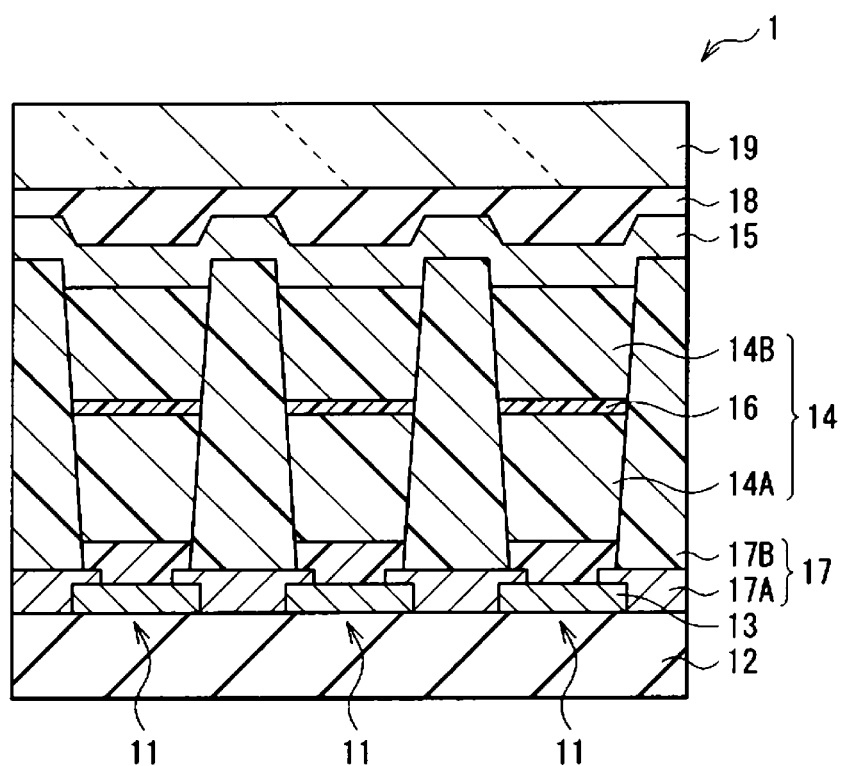
FIG. 5 is a partial cross sectional view showing a structure of the display device shown in FIG. 3.

FIG. 5 shows a partial cross-sectional structure of the display area 110 shown in FIG. 3. Each of the display elements 11 has a structure in which as described above, the anode 13, the partition wall 17, the first light emitting unit 14A and the second light emitting unit 14B including the light emitting layers 14c1 and 14c2, respectively, and the cathode 15 are laminated in this order from the substrate 12 side through the drive transistor Tr1 of the pixel driving circuit 140, and a planarizing insulating film (not shown). In addition, the display elements 11 are all covered with a protective layer 18. Also, an encapsulating substrate 19 made of a glass or the like are stuck to the entire surface of the protective layer 18 through an adhesion layer (not shown) made of a thermosetting resin, an ultraviolet curable resin or the like, thereby encapsulating all of the display elements 11 with the encapsulating substrate 19. A silicon nitride (typically, $Si_3N_4$) film, a silicon oxide (typically, $SiO_2$) film, a silicon nitride oxide ($SiN_xO_y$: x>y in composition ratio) film, a silicon oxynitride ($SiO_xN_y$: x>y in composition ratio) film, a thin film, such as a Diamond Like Carbon (DLC) film, containing therein carbon as a principal component, a Carbon Nanotube (CN) film or the like is used in the protective layer 18. These films are preferably structured in the form of either a single layer or a lamination layer. In particular, the protective film made of the nitride is dense in film quality and thus has a very large blocking effect for moisture, oxygen, and other impurities which exert a bad influence on the display element 11.

The partition wall 17 is provided in order to ensure the insulating property between the anode 13 and the cathode 15, and in order to form the light emitting area into a desired shape. In addition, the partition wall 17 has a function as well as a partition wall when the organic layer 14 is formed through the application by utilizing either an inkjet system or a nozzle coating system. The partition wall 17, for example, has an upper partition wall 17B made of a photosensitive resin such as positive photosensitive polybenzoxazole, positive photosensitive polyimide or the like on a lower partition wall 17A made of an inorganic insulating material such as $SiO_2$ or the like. An opening portion is provided in the partition wall 17 so as to correspond to the light emitting area. It is noted that although the organic layer 14 to the cathode 15 may be provided not only in the opening portion, but also on the partition wall 17, the light is emitted through only the opening portion of the partition wall 17.

The protective layer 18, for example, has a thickness of 2 to 3 μm, and may be made of either an insulating material or a conductive material. An inorganic amorphous insulating material, for example, amorphous silicon (α-Si), an amorphous silicon carbide (α-SiC), an amorphous silicon nitride (α-$Si_{1-x}N_x$), amorphous carbon (α-C) or the like is preferably used as the insulating material for the protective layer 18. Such an inorganic amorphous insulating material is low in water permeability and thus becomes an excellent protective film because it does not compose a grain.

The encapsulating substrate 19 is located on the side of the cathode 15 of the display element 11, and all of the display elements 11 are encapsulated with the encapsulating substrate 19 together with an adhesion layer (not shown). The encapsulating substrate 19 is made of a material such as a glass which is transparent for the light emitted from the display element 11. The encapsulating substrate 19, for example, is provided with a color filter (not shown), and a light blocking film (not shown) serving as a black matrix. As a result, the lights emitted from the display elements 11 are taken out. Also, an outside light which is reflected by wirings among the display elements 11 is absorbed, and thus an excellent contrast is obtained.

The color filter has a red color filter, a green color filter, and a blue color filter (each not shown) which are disposed in order. The red color filter, the green color filter, and the blue color filter, for example, are formed so as to have rectangular shapes, correspondingly, without any space. The red color filter, the green color filter, and the blue color filter are made of resins which are mixed with pigments. Thus, by selecting the pigments, the red color filter, the green color filter, and the blue color filter are adjusted in such a way that light transmittances thereof in the objective red, green and blue wavelength ranges become high, and light transmittances in other wavelength ranges become low.

The light blocking film, for example, is composed of either a black resin film which has an optical density of 1 or more and which is mixed with a black coloring agent or a thin film filter utilizing an interference between the thin films. In particular, the light blocking film is preferably composed of the black resin film because it can be inexpensively, and readily formed. The thin film filter, for example, is formed by laminating one or more thin film made of a metal, a metal nitride or a metal oxide, and thus attenuates the light by utilizing the interference between the thin films. Specifically, the thin film filter includes a thin film filter in which a Cr film and a chromium oxide (III) ($Cr_2O_3$) film are alternately laminated one upon another.

Here, the layers ranging from the anode 13 to the cathode 15, and composing the display element 11 can be formed by utilizing a dry process such as a vacuum evaporation method, an ion beam method (IB method), a molecular beam epitaxy method (MBE method), a sputtering method, or an organic vapor phase deposition (OVPD) method.

In addition, the organic layer 14 can also be formed by utilizing a wet process such as a coating method such as a laser transfer method, a spin coating method, a dipping method, a doctor blade method, an ejection coating method, or a spray coating method, or a printing method such as an inkjet method, an offset printing method, a relief printing method, an intaglio printing method, a screen printing method, or a micro-gravure coating method in addition to the methods described above. Thus, the dry process and the wet process may also be utilized in combination with each other depending on the properties of the organic layers and the members.

In the display device 1, the scanning signals are supplied from the scanning line driving circuit 130 to the pixels through the gate electrodes of the write transistors Tr2. Also, the image signals are supplied from the signal line driving circuit 120 to be held in the hold capacitors Cs through the write transistors Tr2. That is to say, the drive transistor Tr1 is controlled so as to be turned ON or OFF in accordance with the signal held in the hold capacitor Cs. As a result, a drive current Id is injected into each of the display elements 11, so that the hole and the electron are recombined with each other to emit a light. In the case of the bottom-emission type, the light is transmitted through the anode 13 and the substrate 12 to be taken out to the outside. On the other hand, in the case of the top-emission type, the light is transmitted through the cathode 15, the color filter (not shown), and the encapsulating substrate 19 to be taken out to the outside.

At the present time, with regard to an external quantum efficiency of the material used in the light emitting layer, the external quantum efficiency of 5% or more in the fluorescent material, and the external quantum efficiency close to 20% in the phosphorescent material have been reported. In general, since it is considered that an internal quantum efficiency is nearly five times as large as the external quantum efficiency, it is thought that the external quantum efficiency of the phosphorescent material is improved up to a value close to a limit. However, in the electric power efficiency of the existing display device, it has been difficult to continuously attain 100 lm/W level equivalent to the electric power efficiency level of a white fluorescent lamp.

In addition, although depending on the light emitting colors, with regard to a continuous drive life as one of indices of the reliability, a luminous half-life when an initial luminance is set to several thousands of $cd/m^2$ has a large difference of several tens of thousands of hours to several hundreds of thousands of hours. For this reason, the improvements in the dispersion of the lives of the display elements, and the life characteristics thereof become a problem.

On the other hand, in the second embodiment, the material having the photoelectric conversion function is used in the connection layer 16 provided between the first light emitting unit 14A and the second light emitting unit 14B, thereby adding the photoelectric conversion function to the connection layer 16. As a result, there are enhanced the efficiencies of the transport of the holes and the electrons from the anode 13 and the cathode 15 to the organic layer 14: the first light emitting unit 14A; and the second light emitting unit 14B.

As described above, in the display element 11 of the first embodiment, and the display device 1 of the second embodiment including the display element 11 of the first embodiment, the photoelectric conversion function is added to the connection layer 16 through which the organic layer 14: the first light emitting unit 14A; and the second light emitting unit 14B are connected to each other. Therefore, the efficiency of the transport of the electrons to each organic layer 14 is enhanced. That is to say, there are enhanced the efficiencies of the transport of the holes and the electrons to the light emitting layers 14c1 and 14c2 in the first light emitting unit 14A and the second light emitting unit 14B. As a result, in the display element 11, the luminous efficiency is enhanced and the life is improved accordingly. Therefore, it is possible to manufacture the display device having the high long-term reliability.

It is noted that although the display device 1 of the second embodiment includes the display element 11 of the first embodiment, the display device 1 of the second embodiment can also include the display element 21 according to Change of the first embodiment of the present disclosure.

3. Third Embodiment

Electronic Apparatus

An electronic apparatus according to a third embodiment of the present disclosure includes the display device 1 including the plural display elements 11 and serving as the display portion. In this case, in the electronic apparatus of the third embodiment, each of the plural display elements 11 includes the plural light emitting units: the first light emitting unit 14A; and the second light emitting unit 14B laminated through the connection layer 16 between the anode 13 (first electrode) and the cathode 15 (second electrode), and the connection layer 16 contains therein at least one or more kind of material having a photoelectric conversion function.

It is noted that although the electronic apparatus of the third embodiment includes the display device 1 including the display element 11 of the first embodiment, the electronic apparatus of the third embodiment can also include the display device 1 including the display element 21 according to Change of the first embodiment of the present disclosure.

4. Module and Examples of Application

Hereinafter, a description will be given with respect to examples of application of the display device of the second embodiment including the display element described in the first embodiment of the present disclosure. The display device 1 of the second embodiment described above can be applied to the display devices, of electronic apparatuses in all the fields, in each of which a video signal inputted from the outside to the electronic apparatus, or a video signal generated in the electronic apparatus is displayed in the form of an image or a video image. In this case, the electronic apparatuses include a television set, a digital camera, a notebook-size personal computer, a mobile terminal equipment such as a mobile phone, and a video camera.

(Module)

Figure 6:
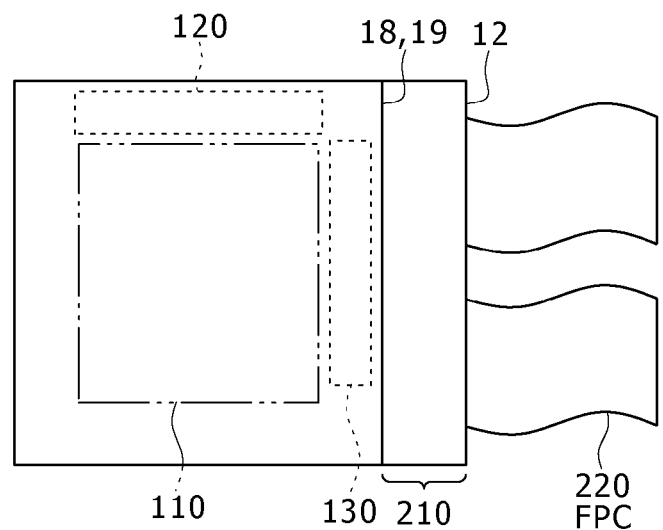
FIG. 6 is a top plan view showing a module-shaped display device in the form of which the display device shown in FIG. 3 of the second embodiment is incorporated in various electronic apparatuses.

The display device 1 of the second embodiment described above is incorporated as a module, for example, as shown in FIG. 6, in various kinds of electronics apparatuses exemplified as first to fifth examples of application which will be described later. In the module, for example, an area 210 exposed from both of the protective layer 18 and the encapsulating substrate 19 in the second embodiment is provided in one side of the substrate 12, and wirings of the signal line driving circuit 120 and the scanning driving circuit 130 (not shown) are made to extend to form external connection terminals (not shown) in the exposed area 210. A flexible printed circuit (FPC) board 220 for input/output of the signals may be provided in those external connection terminals.

First Examples of Application

Figure 7:
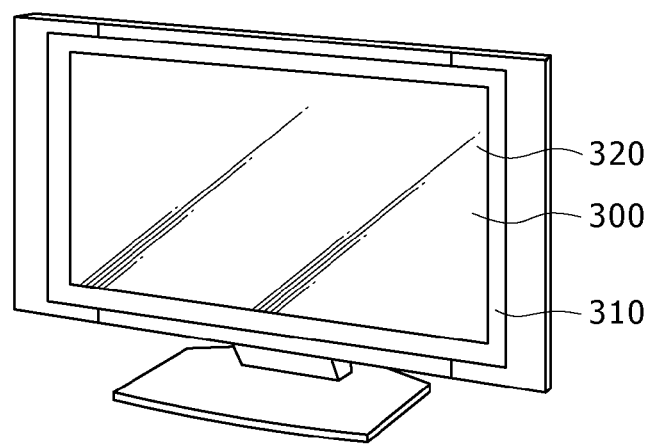
FIG. 7 is a perspective view showing an external appearance of a television set as a first example of application to which the display device shown in FIG. 3 of the second embodiment is applied.

FIG. 7 is a perspective view showing an external appearance of a television set as a first example of application to which the display device of the second embodiment is applied. The television set, for example, includes an image display screen portion 300 composed of a front panel 310 and a filter glass 320. In this case, the image display screen portion 300 is composed of the display device 1 of the second embodiment described above.

Second Example of Application

Figure 8A:
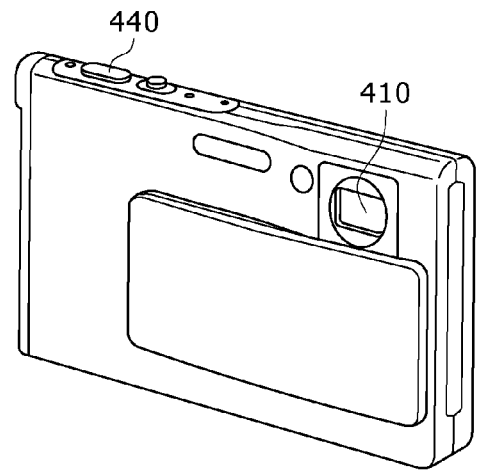
FIGS. 8A and 8B are respectively a perspective view showing an external appearance of a digital camera as a second example of application, when viewed from a front side, to which the display device shown in FIG. 3 of the second embodiment is applied, and a perspective view of the digital camera as the second example of application, when viewed from a back side, to which the display device shown in FIG. 3 of the second embodiment is applied.
Figure 8B:
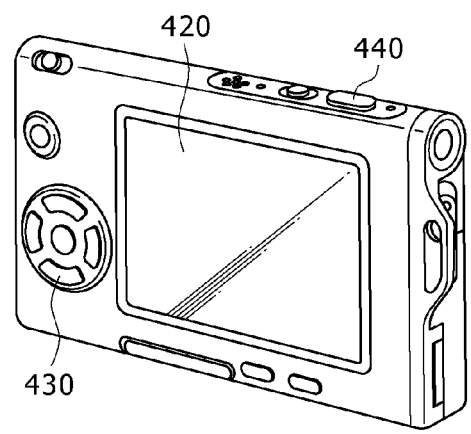

FIGS. 8A and 8B are perspective views showing respective external appearances of a digital camera as a second example of application to which the display device of the second embodiment descried above is applied. The digital camera, for example, includes a light emitting portion 410 for flash, a display portion 420, a menu switch 430, and a shutter button 440. In this case, the display portion 420 is composed of the display device 1 of the second embodiment described above.

Third Example of Application

Figure 9:
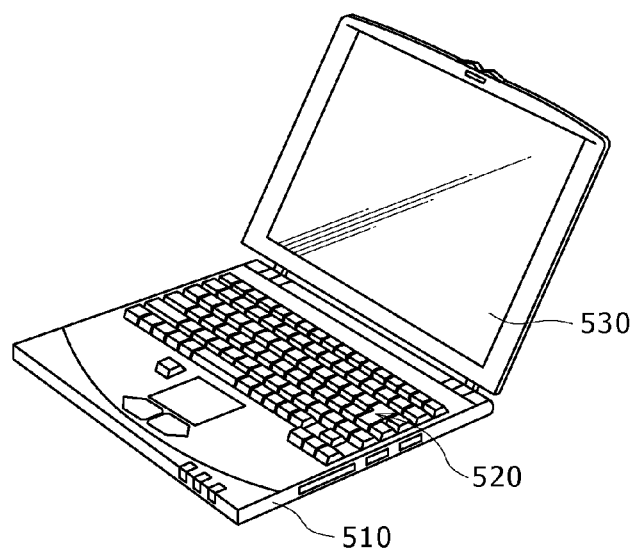
FIG. 9 is a perspective view showing an external appearance of a notebook-size personal computer as a third example of application to which the display device shown in FIG. 3 of the second embodiment is applied.

FIG. 9 is a perspective view showing an external appearance of a notebook-size personal computer as a third example of application to which the display device of the second embodiment described above is applied. The notebook-size personal computer, for example, includes a main body 510, a keyboard 520 which is manipulated when characters or the like are inputted, and a display portion 530 for displaying thereon an image. In this case, the display portion 530 is composed of the display device 1 of the second embodiment described above.

Fourth Example of Application

Figure 10:
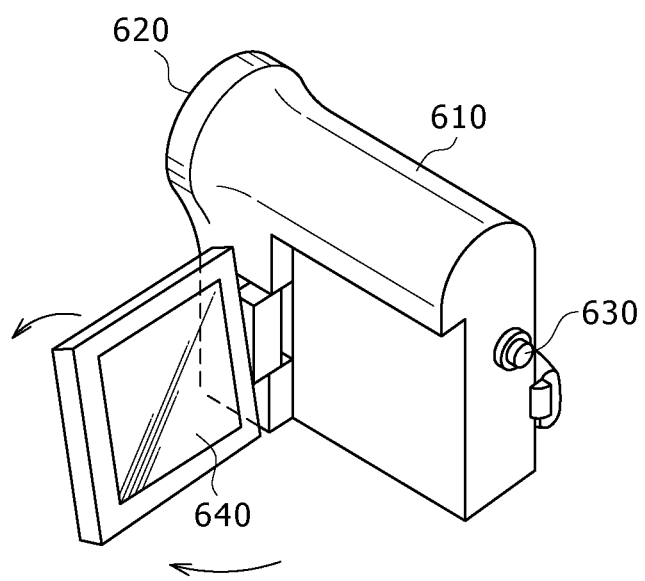
FIG. 10 is a perspective view showing an external appearance of a video camera as a fourth example of application to which the display device shown in FIG. 3 of the second embodiment is applied.

FIG. 10 is a perspective view showing an external appearance of a video camera as a fourth example of application to which the display device of the second embodiment described above is applied. The video camera, for example, includes a main body portion 610, a lens 620 which captures an image of a subject and which is provided on a side surface directed forward, a start/stop switch 630 which is manufactured when an image of a subject is captured, and a display portion 640. In this case, the display portion 640 is composed of the display device 1 of the second described above.

Fifth Example of Application

FIGS. 11A to 11G are respectively views showing respective external appearances of a mobile phone as a fifth example of application to which the display device of the second embodiment described above is applied. The mobile phone, for example, is constructed in such a way that an upper chassis 710 and a lower chassis 720 are coupled to each other through a coupling portion (hinge portion) 730. The mobile phone, for example, includes a display portion 740, a sub-display portion 750, a picture light 760, and a camera 770 in addition to the upper chassis 710, the lower chassis 720, and the coupling portion (hinge portion) 730. In this case, of these constituent elements, either the display portion 740 or the sub-display portion 750 is composed of the display device 1 of the second embodiment described above.

It should be noted that although the display device 1 of the second embodiment including the display element 11 of the first embodiment described above is applied to each of the first to fifth examples of application, the display device including the display element 21 according to Change of the first embodiment can also be applied to each of the first to fifth examples of application.

5. Examples

Next, Examples of the first embodiment will be described in detail. Examples 1 to 15 which will be described below correspond to the first embodiment or Change thereof. Each of Comparative Examples 1 and 2 has the same structure as that of each of Examples 1 to 15 except that the photoelectric conversion unit 16B of the connection layer 16 is not provided.

Examples 1 to 12, and 15, Comparative Example 1

Bottom-Emission Type (BTM)

Firstly, after an ITO layer (having a thickness of about 120 nm) had been formed as the anode 13 on the substrate 12 composed of a glass plate of 30 mm×30 mm, a cell for the display element in which portions other than the light emitting area of 2 mm×2 mm were masked with an insulating film (not shown) was manufactured by evaporating a $SiO_2$ film.

Next, the first light emitting unit 14A was formed. Firstly, 2-TNATA [4,4',4''-tris(2-naphtylphenylamino)triphenylamine) represented by the general formula (7) was formed as the hole injection layer 14a1 at an evaporation rate of 0.2 to 0.4 nm/sec by utilizing a vacuum evaporation method so as to have a thickness of 15 nm. Subsequently, after α-NPD(α-naphthyl phenyl diamine) represented by the general formula (8) had been formed as the hole transport layer 14b1 at the evaporation rate of 0.2 to 0.4 nm/sec by utilizing the vacuum evaporation method so as to have a thickness of 15 nm, ADN represented by the general formula (10) was doped with a dopant BD-052x (manufactured by Idemitsu Kosan Co., Ltd.) so as to form the host for the light emitting layer 14c1 at a thickness of 32 nm in total. Next, Alq3 (8-hydroxy quinoline aluminum) represented by the general formula (9) was evaporated as the electron transport layer 14d1 so as to have a thickness of 18 nm.

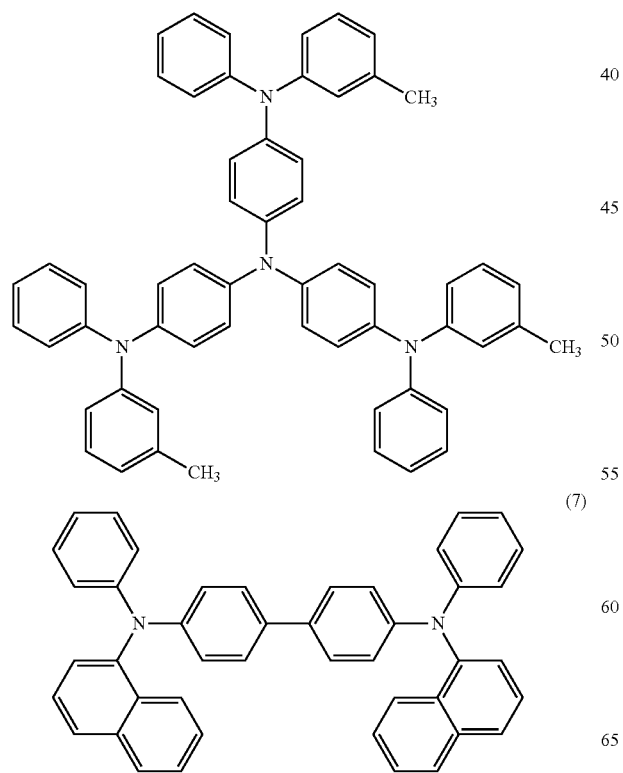

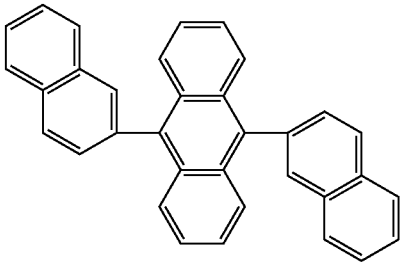

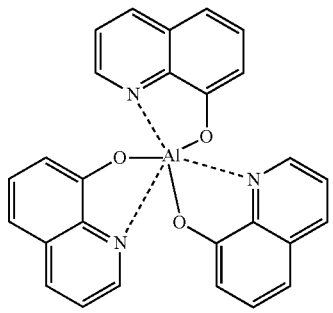

Subsequently, the electron donor unit 16A(26A), the intermediate layer 16B(the intermediate layer 26B: the first layer 26a; and the second layer 26b), and the electron acceptor unit 16C(26C) were formed as the connection layer 16(26) by utilizing the vacuum evaporation method, for example, using the compound represented by the structural formula (3-17) described above.

Next, after the second light emitting unit 14B had been formed similarly to the case of the first light emitting unit 14A described above, a LiF film was formed as the first layer 15A of the cathode 15 at the evaporation rate of –0.01 nm/sec by utilizing the vacuum evaporation method so as to have a thickness of about 0.3 nm. Subsequently, after a MgAg film had been formed as the second layer 15B of the cathode 15 by utilizing the vacuum evaporation method so as to have a thickness of 10 nm, finally, an Al film was formed as the third layer 15C of the cathode 15 so as to have a thickness of 300 nm, thereby manufacturing the display element 11(21).

Examples 13 and 14, Comparative Example 2

Top-Emission Type (TOP)

Each of the display elements of Examples 13 and 14, and Comparative Example 2 was manufactured by utilizing the same method as that in the case of each of Examples 1 to 12 and 15, and Comparative Example 1 except that the anode 13 was made of Cr (having a thickness of 100 nm), and the third layer 15C of the cathode 15 was made of an indium oxide (IXO manufactured by Idemitsu Kosan Co., Ltd.) so as to have a thickness of 200 nm.

A luminous efficiency (cd/A) and a luminance half-life (h) at a current density of 10 $mAcm^{-2}$ were measured with respect to the display element 11 or 21 manufactured in the manner as described above.

Note that, TABLE 1 is a list of element structures, compositions of the connection layer 16(26) in Examples 1 to 15 and Comparative Examples 1 and 2, and a relative luminous efficiency and a relative luminance half-life with each of Comparative Examples 1 and 2 as a reference.

TABLE 1

| | Element structure | Connection layer | | | | | | Relative luminous efficiency | Relative luminance half-life |
|---|---|---|---|---|---|---|---|---|---|
| | | Electron donor unit | | Photoelectric conversion unit | | Electron acceptor unit | | | |
| | | Composing material | Thickness (Å) | Composing material | Thickness (Å) | Composing material | Thickness (Å) | | |
| Example 1 | BTM | LiF/Alq3 + Mg | 10/200 (5%) | Structural formula 3-17 | 50 | HAT-6CN | 80 | 105 | 104 |
| Example 2 | BTM | LiF/Alq3 + Mg | 10/200 (5%) | Structural formula 3-9 | 50 | HAT-6CN | 80 | 103 | 104 |
| Example 3 | BTM | LiF/Alq3 + Mg | 10/200 (5%) | Structural formula 2-1 | 50 | HAT-6CN | 80 | 102 | 100 |
| Example 4 | BTM | LiF/Alq3 + Ca | 10/200 (5%) | Structural formula 1-1 | 50 | HAT-6CN | 80 | 102 | 100 |
| Example 5 | BTM | LiF/Alq3 + Ca | 10/200 (5%) | Structural formula 4-17 | 50 | HAT-6CN | 80 | 105 | 101 |
| Example 6 | BTM | LiF/Alq3 + Mg | 10/200 (5%) | Structural formula 5-1 | 50 | HAT-6CN | 80 | 102 | 104 |
| Example 7 | BTM | Cs/BCP + Cs | 5/100 (5%) | Structural formula 3-17 | 50 | NPD + F4-TCNQ (5%) | 80 | 105 | 104 |
| Example 8 | BTM | Cs/BCP + Cs | 5/100 (5%) | Structural formula 3-9 | 50 | NPD + F4-TCNQ (5%) | 80 | 103 | 100 |
| Example 9 | BTM | Cs/BCP + Cs | 5/100 (5%) | Structural formula 2-1 | 50 | NPD + F4-TCNQ (5%) | 80 | 102 | 100 |
| Example 10 | BTM | Cs/BCP + Cs | 5/100 (5%) | Structural formula 1-1 | 50 | NPD + F4-TCNQ (5%) | 80 | 102 | 103 |
| Example 11 | BTM | Cs/BCP + Cs | 5/100 (5%) | Structural formula 4-17 | 50 | NPD + F4-TCNQ (5%) | 80 | 105 | 103 |
| Example 12 | BTM | LiF/Alq3 + Mg | 10/200 (5%) | Structural formula 3-17 | 100 | HAT-6CN | 80 | 107 | 108 |
| Example 13 | TOP | LiF/Alq3 + Mg | 10/200 (5%) | Structural formula 3-17 | 50 | HAT-6CN | 80 | 108 | 110 |
| Example 14 | TOP | LiF/Alq3 + Mg | 10/200 (5%) | Structural formula 3-17/ Structural formula 6-1 | 25/25 | HAT-6CN | 80 | 105 | 110 |
| Example 15 | BTM | LiF/Alq3 + Mg | 10/200 (5%) | Structural formula 3-17/ Structural formula 6-1 | 25/25 | NPD + F4-TCNQ (5%) | 80 | 104 | 103 |
| Comparative Example 1 | BTM | LiF/Alq3 + Mg | 10/200 (5%) | — | — | HAT-6CN | 80 | 100 | 100 |
| Comparative Example 2 | TOP | LiF/Alq3 + Mg | 10/200 (5%) | — | — | HAT-6CN | 80 | 100 | 100 |

From TABLE 1, the luminous efficiency is enhanced in any of Examples 1 to 12 by using the material having the photoelectric conversion function in the connection layer 16(26). In addition, the luminance half-life is also improved. In particular, in the top-emission type display element (of each of Examples 13 and 14), a large effect is obtained in the enhancement of the luminous efficiency, and the improvement in the luminance half-life. With regard to this cause, it is thought that the top-emission type cavity effect effectively increases the light absorption to the connection layer 16 or 26 having the photoelectric conversion function.

Although the present disclosure has been described so far based on the embodiments and Change, the present disclosure is by no means limited thereto, and thus the various kinds of changes can be made.

For example, although the display device utilizing the active matrix system using the TFT substrate has been described in the embodiment and the like, the present disclosure is by no means limited thereto, and thus may also be applied to a display device utilizing a passive system.

In addition, the case of the top-emission type in which the light is taken out from the cathode 15 side provided on the side opposite to the substrate 12 has been described in the embodiments and the like. However, as shown in Examples, the display element 11(21) according to (Change of) the first embodiment of the present disclosure is structured by using the transparent material in the substrate 12, whereby the present disclosure can also be applied to the bottom-emission type display element. In this case, the layers composing the lamination structure of the display element 11(21) shown in FIG. 1 (FIG. 2) may be reversely laminated from the substrate 12 side, or the same structure as the lamination structure of the display element 11(21) may also be formed on a transparent electrode formed on a transparent substrate. In addition thereto, the cathode 15 becoming the upper electrode is made of a transparent material, which results in that the lights can be taken out from the both sides, that is, from the substrate 12 side and the side opposite to the substrate 12 side.

The present application contains subject matter related to that disclosed in Japanese Priority Patent Application JP 2011-066746 filed in the Japan Patent Office on Mar. 24, 2011, the entire content of which is hereby incorporated by reference.

What is claimed is:

1. A display element, comprising: plural light emitting units laminated through a connection layer between a first electrode and a second electrode, wherein said connection layer contains therein at least one or more kinds of materials having a photoelectric conversion function, wherein said connection layer has a structure in which an electron donor unit, a photoelectric conversion unit, and an electron acceptor unit are laminated in order from said first electrode, and wherein an energy level of the lowest unoccupied molecular orbital of said photoelectric conversion unit is equal to or smaller than a shallow value when viewed from a vacuum level of the lowest unoccupied molecular orbital of each of an electron donating unit and an electron accepting unit each being adjacent to said photoelectric conversion unit.

2. The display element according to claim 1, wherein said connection layer has a structure in which an electron donor unit, an electron acceptor photoelectric conversion unit, an electron donor photoelectric conversion unit, and an electron acceptor unit are laminated in order from said first electrode.

3. The display element according to claim 1, wherein said material having the photoelectric conversion function is a compound represented by the general formula (1):

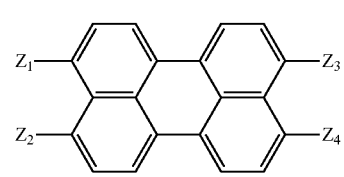

(1)

in which Z1 to Z4 are independently groups each having a carbonyl group or derivatives thereof, and Z1, Z2, Z3, and Z4 form cyclic structures each obtained through nitrogen or oxygen, respectively.

4. The display element according to claim 1, wherein said material having the photoelectric conversion function is a compound represented by the general formula (2):

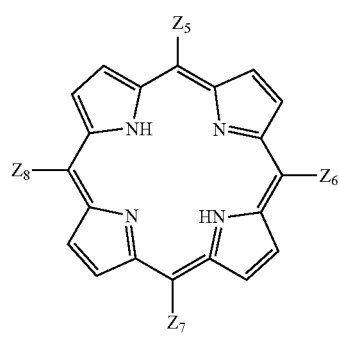

(2)

in which Z5 to Z8 are independently aromatic ring groups, heterocyclic groups or derivatives thereof, respectively.

5. The display element according to claim 1, wherein said material having the photoelectric conversion function is a compound represented by the general formula (3):

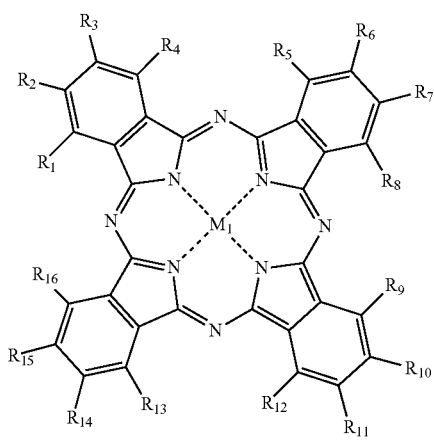

(3)

in which R1 to R16 are independently hydrogen atoms, halogen atoms, hydrocarbon groups each having a carbon number of 1 to 12 or derivatives thereof, respectively, and M1 is a metallic atom belonging to any of IV to XIV groups in the periodic table, or an atomic group containing therein the metallic atom concerned, an oxygen atom, a halogen atom, a cyano group, a methoxy group or the like as a ligand.

6. The display element according to claim 1, wherein said material having the photoelectric conversion function is a compound represented by the general formula (5):

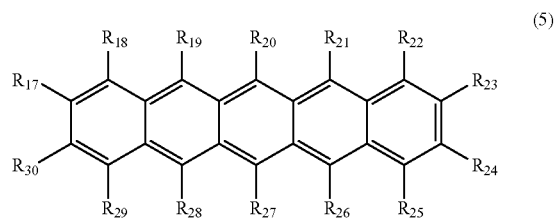

(5)

in which R17 to R30 are independently hydrogen atoms, halogen atoms, hydrocarbon groups each having a carbon number of 1 to 12 or derivatives thereof, respectively.

7. The display element according to claim 1, wherein said material having the photoelectric conversion function is fullerene, carbon nanotube, and grapheme each having a carbon number of 60 or more, and a derivative thereof.

8. An electronic apparatus, comprising: a display device including plural display elements and serving as a display portion, wherein each of said plural display elements includes the display element according to claim 1.

9. A display element, comprising: plural light emitting units laminated through a connection layer between a first electrode and a second electrode, wherein said connection layer contains therein at least one or more kinds of materials having a photoelectric conversion function, wherein said connection layer has a structure in which an electron donor unit, a photoelectric conversion unit, and an electron acceptor unit are laminated in order from said first electrode, and wherein an energy level of the highest occupied molecular orbital of said photoelectric conversion unit is equal to or larger than a shallow value when viewed from a vacuum level of the highest occupied molecular orbital of each of an electron donating unit and an electron accepting unit each being adjacent to said photoelectric conversion unit.

10. The display element according to claim 1, wherein said material having the photoelectric conversion function is a compound represented by the general formula (4):

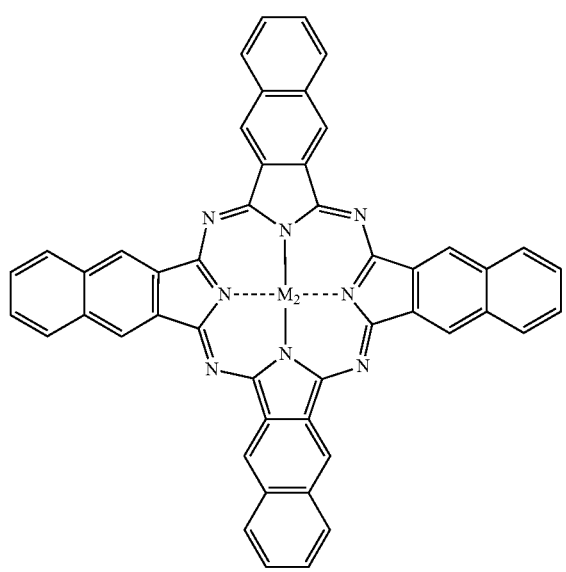

(4)

in which M2 is a metallic atom belonging to any of IV to XIV groups in the periodic table, or an atomic group containing therein the metallic atom concerned, an oxygen atom, a halogen atom, a cyano group, a methoxy group or the like as a ligand.

11. The display element according to claim 9, wherein said connection layer has a structure in which an electron donor unit, an electron acceptor photoelectric conversion unit, an electron donor photoelectric conversion unit, and an electron acceptor unit are laminated in order from said first electrode.

12. The display element according to claim 9, wherein said material having the photoelectric conversion function is a compound represented by the general formula (1):

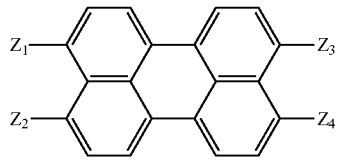

(1)

in which Z1 to Z4 are independently groups each having a carbonyl group or derivatives thereof, and Z1, Z2, Z3, and Z4 form cyclic structures each obtained through nitrogen or oxygen, respectively.

13. The display element according to claim 9, wherein said material having the photoelectric conversion function is a compound represented by the general formula (2):

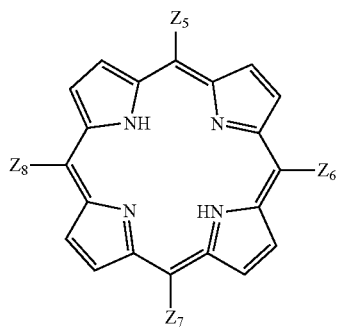

(2)

in which Z5 to Z8 are independently aromatic ring groups, heterocyclic groups or derivatives thereof, respectively.

14. The display element according to claim 9, wherein said material having the photoelectric conversion function is a compound represented by the general formula (3):

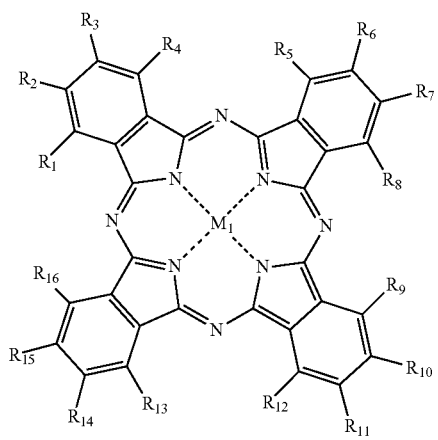

(3)

in which R1 to R16 are independently hydrogen atoms, halogen atoms, hydrocarbon groups each having a carbon number of 1 to 12 or derivatives thereof, respectively, and M1 is a metallic atom belonging to any of IV to XIV groups in the periodic table, or an atomic group containing therein the metallic atom concerned, an oxygen atom, a halogen atom, a cyano group, a methoxy group or the like as a ligand.

15. The display element according to claim 9, wherein said material having the photoelectric conversion function is a compound represented by the general formula (4):

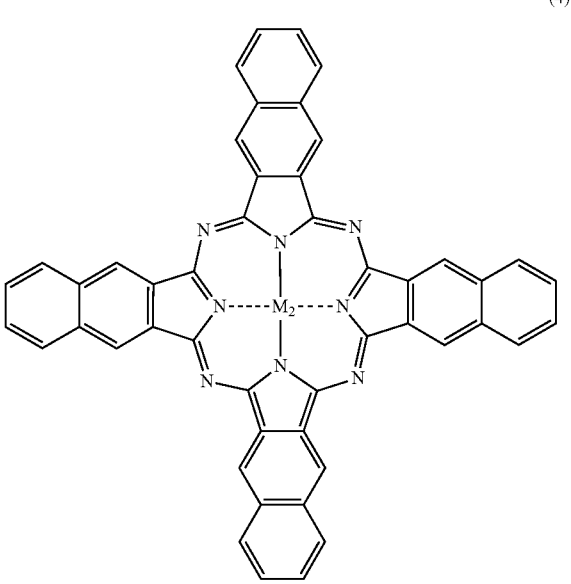

(4)

in which M2 is a metallic atom belonging to any of IV to XIV groups in the periodic table, or an atomic group containing therein the metallic atom concerned, an oxygen atom, a halogen atom, a cyano group, a methoxy group or the like as a ligand.

16. The display element according to claim 9, wherein said material having the photoelectric conversion function is a compound represented by the general formula (5):

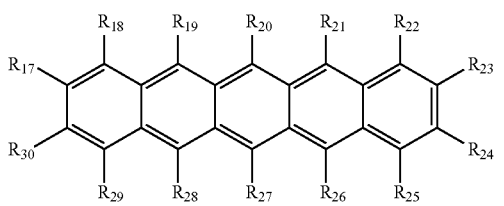

(5)

in which R17 to R30 are independently hydrogen atoms, halogen atoms, hydrocarbon groups each having a carbon number of 1 to 12 or derivatives thereof, respectively.

17. The display element according to claim 9, wherein said material having the photoelectric conversion function is fullerene, carbon nanotube, and grapheme each having a carbon number of 60 or more, and a derivative thereof.

18. A display device, comprising: plural display elements, wherein each of said plural display elements includes the display element according to claim 9.

19. An electronic apparatus, comprising: a display device including plural display elements and serving as a display portion, wherein each of said plural display elements includes the display element according to claim 9.

20. A display device, comprising: plural display elements, wherein each of said plural display elements includes plural light emitting units laminated through a connection layer between a first electrode and a second electrode, and said connection layer contains therein at least one or more kinds of materials having a photoelectric conversion function, wherein said connection layer has a structure in which an electron donor unit, a photoelectric conversion unit, and an electron acceptor unit are laminated in order from said first electrode, and wherein an energy level of the lowest unoccupied molecular orbital of said photoelectric conversion unit is equal to or smaller than a shallow value when viewed from a vacuum level of the lowest unoccupied molecular orbital of each of an electron donating unit and an electron accepting unit each being adjacent to said photoelectric conversion unit.

\* \* \* \* \*